United States Patent
Huang et al.

(10) Patent No.: US 12,550,469 B2
(45) Date of Patent: Feb. 10, 2026

(54) SEMICONDUCTOR DEVICE HAVING ISOLATION STRUCTURES IN PIXEL REGION AND MANUFACTURING METHOD THEREOF

(71) Applicant: TAIWAN SEMICONDUCTOR MANUFACTURING COMPANY LTD., Hsinchu (TW)

(72) Inventors: Shih-Han Huang, Kaohsiung (TW); Yen-Ting Chiang, Tainan (TW); Shyh-Fann Ting, Tainan (TW); Jen-Cheng Liu, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 372 days.

(21) Appl. No.: 17/358,132

(22) Filed: Jun. 25, 2021

(65) Prior Publication Data
US 2022/0415935 A1    Dec. 29, 2022

(51) Int. Cl.
*H10F 39/00*    (2025.01)
*H10F 39/18*    (2025.01)

(52) U.S. Cl.
CPC ......... *H10F 39/807* (2025.01); *H10F 39/014* (2025.01); *H10F 39/18* (2025.01); *H10F 39/811* (2025.01)

(58) Field of Classification Search
CPC .......... H01L 27/1463; H01L 27/14636; H01L 27/14643; H01L 27/14689
See application file for complete search history.

(56) References Cited

U.S. PATENT DOCUMENTS

| | | | |
|---|---|---|---|
| 8,736,006 B1 * | 5/2014 | Tsai | H01L 27/14692 438/70 |
| 2017/0047367 A1 * | 2/2017 | Lee | H01L 27/1463 |
| 2017/0213802 A1 * | 7/2017 | Pan | H01L 21/0334 |
| 2019/0067357 A1 * | 2/2019 | Cheng | H01L 27/14621 |
| 2020/0058684 A1 * | 2/2020 | Wu | H01L 27/14634 |
| 2020/0075643 A1 * | 3/2020 | Han | H10F 39/8027 |
| 2020/0119072 A1 * | 4/2020 | Lim | G02B 1/14 |

* cited by examiner

*Primary Examiner* — Norman D Richards
*Assistant Examiner* — Sean Ayers Winters
(74) *Attorney, Agent, or Firm* — WPAT LAW; Anthony King

(57) ABSTRACT

The present disclosure provides a semiconductor structure and a method for fabricating a semiconductor structure, wherein the semiconductor structure includes a device layer, including a terminal region and a pixel region adjacent to the terminal region, a conductive pad in the terminal region, and an isolation structure in the pixel region, wherein the isolation structure includes a first conductive material.

20 Claims, 28 Drawing Sheets

SEMICONDUCTOR DEVICE HAVING ISOLATION STRUCTURES IN PIXEL REGION AND MANUFACTURING METHOD THEREOF

BACKGROUND

Image sensors are widely used in various imaging applications and products, such as cameras, scanners, photocopiers, etc. Performance of an image sensor depends on quality of pixels in the image sensors. As a part of IC evolution for semiconductor image sensors, the size of pixels has been steadily reduced. As the size of pixels continue to shrink, quality of pixels become more difficult to control. The quality of pixels can affect performance such as an amount of dark current or leakage current, which may be a source for noise in the image sensors. Furthermore, other defects (such as crosstalk issues, white pixel, low quantum efficiency, or the like) may also affect the performance of an image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
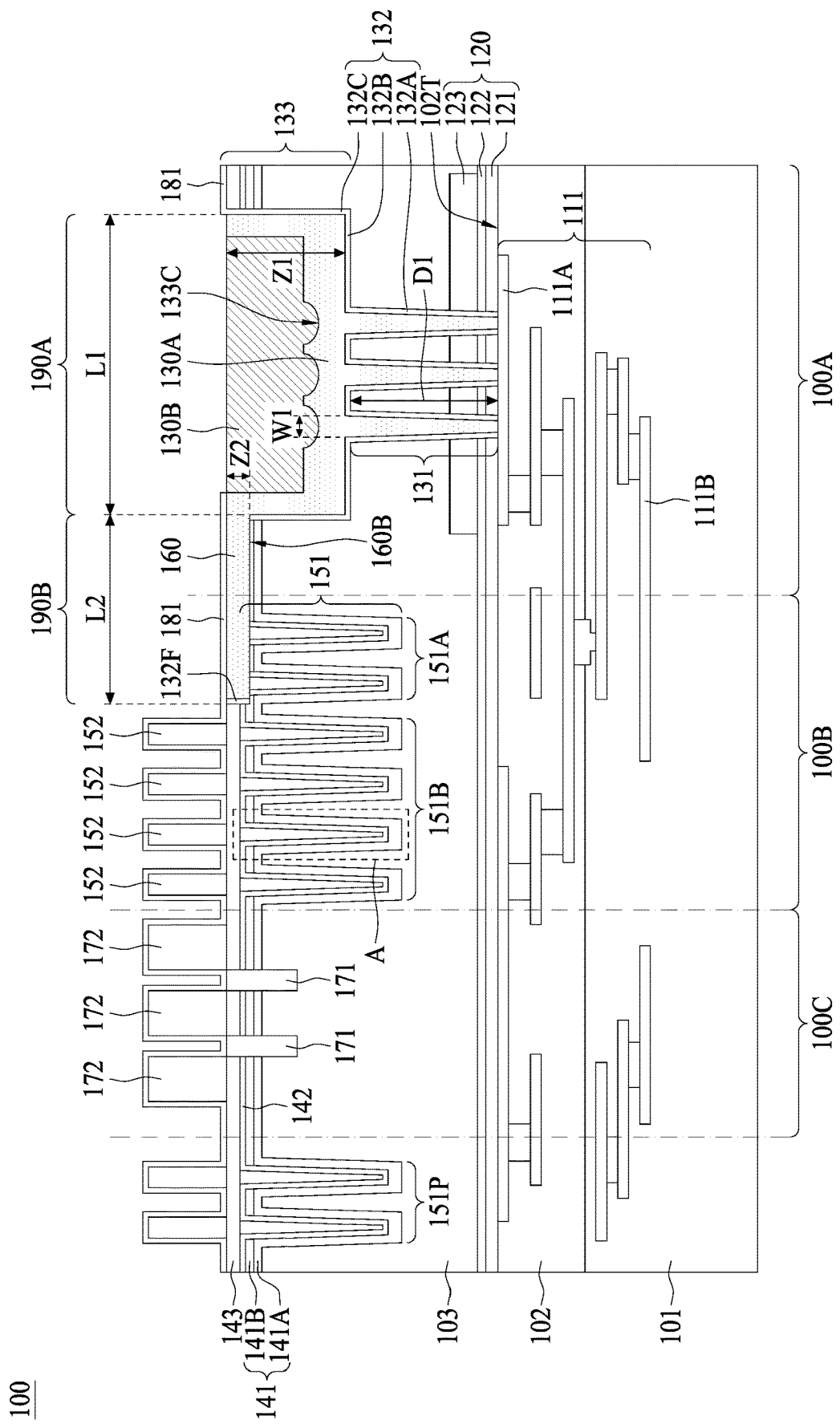
FIG. 1A is a cross sectional view of a semiconductor device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The semiconductor integrated circuit (IC) industry has experienced exponential growth. With the trend of scaling down the geometry size and the pitches between pixels or optical features, addressing the issues of dark current, leakage current, crosstalk, white pixel, low quantum efficiency, or the like, becomes more important. Furthermore, it is important to addressing the aforesaid issues to in a fashion that is compatible with certain field of device fabrication operations (such as compatible with Complementary Metal-Oxide-Semiconductor (CMOS) fabrication, or backside illuminated (BSI) image sensor fabrication).

Furthermore, conductive pads can be utilized for device testing, such as the condition of electrical connection or various electrical properties. However, in advanced technology node (such as beyond N28 and/or having a silicon layer thicker than 6 nm), seams or peelings may occur at positions proximal to the conductive pads. In a comparative embodiment, the formation of conductive pads in a silicon layer includes forming a first oxide layer in a silicon layer, embedding the conductive pads in the first oxide layer, and forming a second oxide layer partially expose the conductive pads. However, seams or peeling may occur between silicon layer, first oxide layer, second oxide layer, or proximal dielectric films due to poor adhesion. The operation windows for performing etching operation may also occur due to the reduced thickness of dielectric films, thus making it more difficult to control the accuracy of etching operation.

The present disclosure provides a semiconductor device with conductive isolation structure and a method for fabricating a semiconductor device to alleviate the issue(s) related to dark current, leakage current, crosstalk, white pixel, low quantum efficiency. The present disclosure further provides methods for forming conductive pads that can be compatible to the formation of conductive isolation structure and alleviate seams/peeling issues due to poor adhesion between dielectric films. In some embodiments, the conductive pads can further be utilized to as a medium to apply bias voltage to the isolation structure to improve the performance thereof.

Figure 1B:
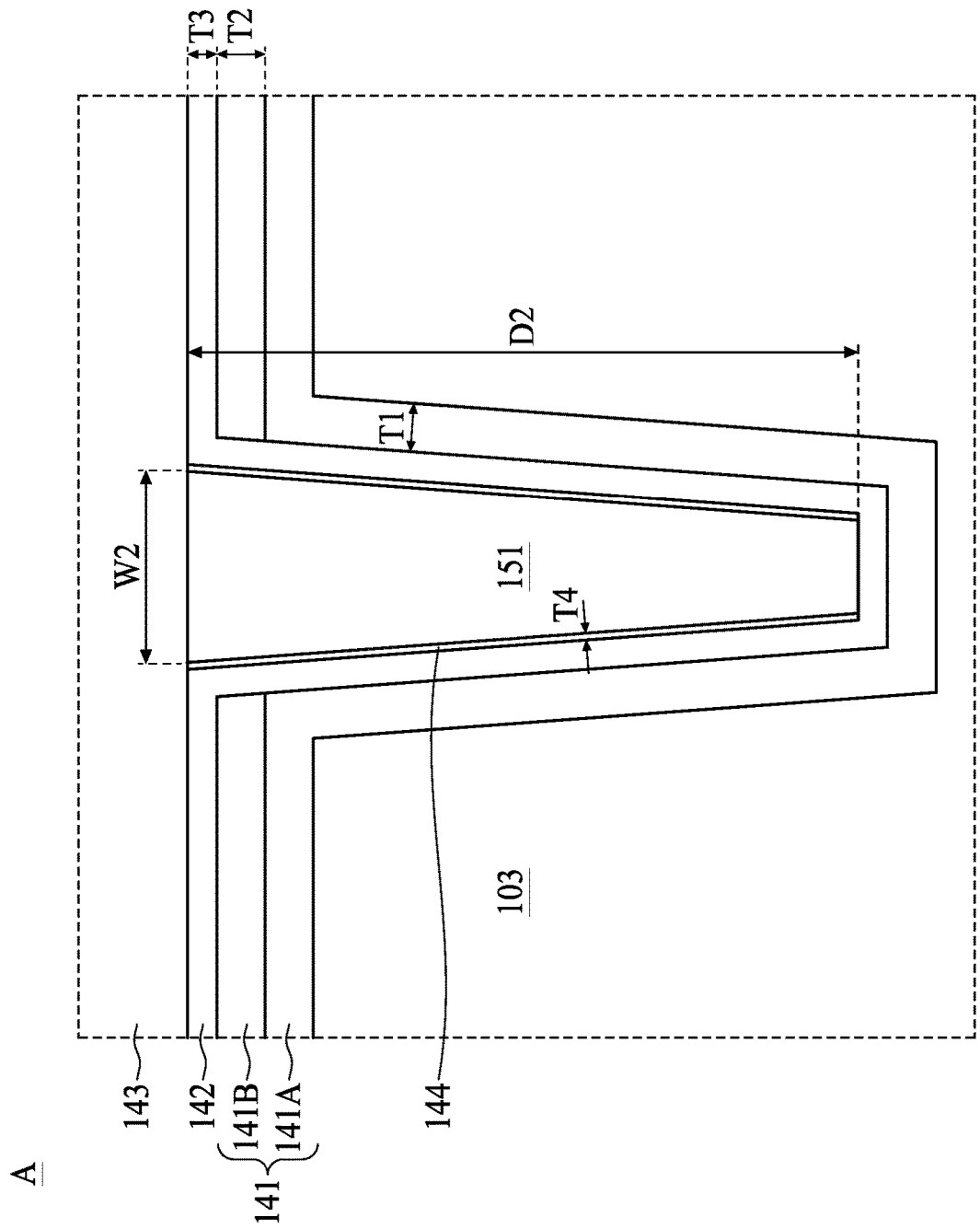
FIG. 1B is a partially enlarged fragmentary diagrammatic view of portion A of the semiconductor device of FIG. 1A, according to some embodiments of the present disclosure.

Referring to FIG. 1A and FIG. 1B, FIG. 1A is a cross sectional view of a semiconductor device, FIG. 1B is a partially enlarged fragmentary diagrammatic views of portion A of the semiconductor device of FIG. 1A, according to some embodiments of the present disclosure. A semiconductor device 100 includes a logic layer including an ASIC die, including a semiconductor portion 101 of a logic layer and a metallization portion 102 of the logic layer over the semiconductor portion 101. Alternatively stated, the logic layer includes the semiconductor portion 101 and the metallization portion 102. In some embodiments, the semiconductor portion 101 may include integrated circuits, such as Application Specific Integrated Circuit (ASIC). The semiconductor portion 101 (and the device layer 103 as will be subsequently discussed) includes a terminal region 100A and a pixel region 100B different from the terminal region 100A. In some of the embodiments, the terminal region 100A is adjacent to the pixel region 100B. In some of the embodiments, the semiconductor portion 101 may further include a functional region 100C different from the terminal region 100A and the pixel region 100B. The metallization portion 102 may include insulation layer over the terminal region 100A, the pixel region 100B, and the functional region 100C. In some embodiments, a conductive routing 111 (or metallization feature) may be disposed in the semiconductor portion 101 and the metallization portion 102. The conductive routing 111 includes a first metal line 111A in the metallization portion 102 and proximal to a top surface 102T of the metallization portion 102. The conductive routing 111 includes may further include conductive features 111B in the semiconductor portion 101, wherein the first metal line 111A and the conductive features 111B may be electronically connected.

The semiconductor device 100 further includes a device layer 103 formed above the top surface 102T of the metallization portion 102. In some embodiments, the device layer 103 may be silicon (either doped or undoped), or other materials that can be utilized as part of system-on-chip (SOC). The semiconductor device 100 further includes an insulating film stack 120 disposed between the device layer 103 and the top surface 102T of the metallization portion 102. In some of the embodiments, the insulating film stack 120 may include etch stop layer(s), for example, a first etch stop layer 121 and a second etch stop layer 122 over the first etch stop layer 121. However, the total amount of etch stop layers is not limited in the present disclosure. In some of the embodiments, the insulating film stack 120 may include isolation film 123 over the top surface 102T of the metallization portion 102 (or over the aforesaid etch stop layer(s) if presented). In some embodiments, the isolation film 123 may be made of insulation material that can be used as part of shallow isolation trench (STI), for example, oxide-based material or oxide-containing material. In some embodiments, the first etch stop layer 121 and the second etch stop layer 122 may be disposed over the terminal region 100A, the pixel region 100B, and the functional region 100C of the semiconductor portion 101. In some embodiments, the isolation film 123 may be disposed over a portion of the terminal region 100A.

The semiconductor device 100 further includes a conductive pad 133 in the device layer 103 and over the terminal region 100A. In some embodiments, the conductive pad 133 may include a plurality of conductive materials, for example, a conductive material layer 130A and a conductive material layer 130B. In the embodiments discussed in FIG. 1A, the conductive material layer 130A is different from the conductive material layer 130B. For example, the conductive material layer 130A can include copper, aluminum copper or other suitable material, and the conductive material layer 130B can include aluminum copper or other suitable material. It should be noted that the conductive pad 133 being made of single type of material will be subsequently discussed in FIG. 1C.

In some embodiments, the conductive material layer 130A may have a concaved surface 133C, and the conductive material layer 130B is disposed over the concaved surface 133C of the conductive material layer 130A. The conductive material layer 130A laterally surrounds the conductive material layer 130B. In some of the embodiments, a top surface of the conductive material layer 130A may be coplanar with a top surface of the conductive material layer 130B.

The semiconductor device 100 further includes one or more conductive via 131 electrically connecting between the conductive pad 133 and the underlying conductive routing 111 (for example, the first metal line 111A directly below the conductive pad 133). In some of the embodiments, one or more conductive via 131 may penetrate the insulating film stack 120 and being in direct contact with the first metal line 111A. A material of the conductive via(s) 131 may be identical with the material of the conductive material layer 130A, such as copper, aluminum copper or other suitable material. A width W1 at a top of the conductive via(s) 131 may be in a range from about 0.7 μm to about 3.8 μm. If the width W1 is greater than the aforesaid range, it may deviate from the purpose of scaling down dimensional size of the semiconductor device 100. If the width W1 is less than the aforesaid range, the conductive material filling for forming the conductive via 131 may become difficult. A height D1 of the conductive via(s) 131 may be in a range from about 3 μm to about 10 μm. If the height D1 is greater than the aforesaid range, the conductive material filling for forming the conductive via 131 may become difficult. If the height D1 is less than the aforesaid range, a distance between the conductive pad 133 and the conductive routing 111 may be too close, which may cause breakdown or other types of reliability issues. The semiconductor device 100 further includes liner 132 lining the profile of the conductive pad 133 and the conductive via(s) 131. For example, the liner 132 includes a first portion 132A conforming the sidewalls of the conductive via(s) 131, a second portion 132B conforming a bottom surface of the conductive pad 133, and a third portion 132C conforming the sidewalls of the conductive pad 133. In some embodiments, a material of the liner 132 may be oxide and/or silicon nitride, or other suitable material.

The semiconductor device 100 further includes isolation structures 151 disposed at a level above pixels (not shown in FIG. 1A) over the pixel region 100B. The isolation structures 151 may be at a side distal from the semiconductor portion 101 and partially surrounded by the device layer 103 laterally. The isolation structures 151 may be deep trench isolation (DTI) for alleviating crosstalk issue. In some embodiments, a first group of isolation structures 151A and a second group of isolation structures 151B of the isolation structures 151 are disposed in the pixel region 100B. In some embodiments, a top of each of the second group of isolation structures 151B is at a level above a level of each of the first group of isolation structures 151A. In some embodiments, the first group of isolation structures 151A and the second group of isolation structures 151B may include conductive materials, such as aluminum or other suitable conductive material. A width W2 at a top of each of the isolation structures 151 may be in a range from about 90 nm to about 300 nm. If the width W2 is greater than the aforesaid range, it may deviate from the purpose of scaling down dimensional size of the semiconductor device 100. If the width W2 is less than the aforesaid range, the conductive material filling for forming the isolation structures 151 may become difficult, or, the reliability of the isolation structures 151 may be reduced. A height D2 of each of the isolation structures 151 may be in a range from about 1.5 μm to about 6 μm. If the height D2 is greater than the aforesaid range, the conductive material filling for forming the isolation structures 151 may become difficult. If the height D2 is less than the aforesaid range, the crosstalk issue may not be effectively alleviated.

In some of the embodiments, the isolation structures 151 may further include third group of isolation structures 151P in areas different from the terminal region 100A, the pixel region 100B, and the functional region 100C. The isolation structures 151P may include deep trench isolations arranged in array(s).

The semiconductor device 100 may further include a dielectric stack 141 over the device layer 103. For example, the dielectric stack 141 may include a first spacer 141A and a second spacer 141B over the first spacer 141A. In some embodiments, a material of the dielectric stack 141 can include high-k materials. In some embodiments, the first spacer 141A may include aluminum oxide ($Al_xO_y$) and hafnium oxide ($Hf_xO_y$). In some embodiments, the second spacer 141B may include tantalum oxide ($Ta_xO_y$). The first spacer 141A may further a portion laterally surround the sidewalls of the isolation structures 151. In some embodiments, the first spacer 141A may further include a portion below a bottom surface of the isolation structures 151. A thickness T2 of the second spacer 141B may be in a range from about 430 Angstrom to about 520 Angstrom. In some alternative embodiments, the dielectric stack 141 may include one high-k layer. In some alternative embodiments, the dielectric stack 141 may include three or more high-k layer. In some of the embodiments, the semiconductor device 100 further includes a thin film 142 over the dielectric stack 141. In some embodiments, the thin film may include oxide, which may be fabricated by using atomic layer deposition (ALD), plasma enhanced oxide deposition operation, and/or other fabrication operations that has relatively higher thickness accuracy. A thickness T3 of the thin film 142 may be in a range from substantially 0 Angstrom to about 200 Angstrom. In some embodiments, a thickness T1 of the first spacer 141A may be less than the thickness T2 of the second spacer 141B, for example, around 100 Angstrom (e.g. including aluminum oxide with a thickness around 40 Angstrom and hafnium oxide with a thickness around 60 Angstrom), but the present disclosure is not limited thereto.

In some embodiments, the thin film 142 may further include a portion laterally surrounds the sidewalls of the isolation structures 151. In some embodiments, the thin film 142 may further include a portion below a bottom surface of the isolation structures 151. The semiconductor device 100 may further include a liner 144 lining at the sidewalls of each of the isolation structures 151. In some embodiments, the liner 144 may include titanium aluminum (TiAl) or other suitable material. In some embodiments, a thickness of the liner 144 may be in a range from about substantially 0 Angstrom to about 40 Angstrom.

The semiconductor device 100 may further include a capping layer 143 over the thin film 142 and the dielectric stack 141. In some embodiments, the capping layer 143 may include oxide, which can be formed by low pressure radical oxidation operation (LPRO) or other suitable operations. In some embodiments, the capping layer 143 is above the second group of isolation structures 151B. Alternatively stated, a bottom surface of the capping layer 143 may be above a top surface of the isolation structures 151B. In some of the embodiments, a top surface of each of the top portion of the second group of isolation structures 151B may be coplanar with a top surface of the thin film 142. In some embodiments, the first group of isolation structures 151A may be free from being under a coverage of the capping layer 143.

In some embodiments, the semiconductor device 100 may further include fins 152 above the capping layer 143 over the pixel region 100B. In some of the embodiments, the fins 152 are at a position corresponding to each of the second group of isolation structures 151B. In some embodiments, the fins 152 can be dielectric fins, high-k fins, or made of other suitable materials utilized in fins. Some grids, waveguide structures, or optical devices can be further formed over the pixel region 100B. Alternatively, some or all of the fins 152 can be substituted with grids, waveguide structures, or optical devices can also be disposed above the capping layer 143 over the pixel region 100B.

In some embodiments, the semiconductor device 100 may further include a conductive layer 160, wherein the conductive layer 160 electrically connects to a conductive pad 133 in a first area 190A over the terminal region 100A and the first group of isolation structures 151A over the pixel region 100B. The conductive layer 160 may occupy a second area 190B next to the first area 190A. In some of the embodiments, at least one or more isolation structure 151 from the first group of isolation structures 151A is connected to the conductive layer 160. In some embodiments, one or more isolation structure 151 from the first group of isolation structures 151A may be under a coverage of a vertical projection of the conductive layer 160. Alternatively stated, the conductive layer 160 extends from the conductive pad 133 over the terminal region 100A to a position above the first group of isolation structures 151A over the pixel region 100B. A bottom surface 160B of the conductive layer 160 may be in direct contact to a top surface of each of the first group of isolation structures 151A. A material of the conductive layer 160 may be identical to the material of the conductive material layer 130A of the conductive pad 133, for example aluminum copper, copper, or other suitable materials. In some embodiments, the bottom surface 160B of the conductive layer 160 may stop at the dielectric stack 141, for example, stop at the second spacer 141B.

In some embodiments, at least one or more isolation structure 151 from the first group of isolation structures 151A is electrically connected to the at least one or more isolation structure 151 from the second group of isolation structures 151B through additional routings (not shown in FIG. 1A) of the isolation structure 151, such that conductive pad 133, the conductive layer 160, the first group of isolation structures 151A, and the second group of isolation structures 151B may form a conductive path.

In some embodiments, a thickness Z1 of the conductive pad 133 is in a range from about 12,000 Angstrom to about 28,000 Angstrom, and a width L1 of the conductive pad 133 is in a range from about 70 μm to about 100 μm. A thickness Z2 of the conductive layer 160 is less than the thickness Z1 of the conductive pad 133. In some embodiments, the thickness Z2 of the conductive layer 160 is in a range from around 500 Angstrom to about 2,000 Angstrom, and a width L2 of the conductive layer 160 is in a range from about 70 μm to about 100 μm. If the thickness Z1 is less than the aforesaid range, the reliability issue of the conductive pad 133 may occur. If the thickness Z1 is greater than the aforesaid range, it may deviate from the purpose of scaling down dimensional size of the semiconductor device 100. If the width L1 is less than the aforesaid range, the space for conducting testing by using conductive pad 133 or placing solder bumps above the conductive pad 133 may be inadequate. If the width L1 is greater than the aforesaid range, it may deviate from the purpose of scaling down dimensional size of the semiconductor device 100. If the thickness Z2 is less than the aforesaid range, the reliability issue of the conductive layer 160 may occur, or, the resistivity may be increased. If the thickness Z2 is greater than the aforesaid range, it may deviate from the purpose of scaling down dimensional size of the semiconductor device 100. However, it should be noted that the range of thickness Z1, thickness Z2, width L1, and width L2 may be adjusted based on specific design rule, device size or application of device.

In some embodiments, a liner 132F of the liner 132 is lining at a sidewall of the conductive layer 160 above the pixel region 100B. In some embodiments, a material of the liner 132F is identical to a material of the liner 132 as previously discussed, such as oxide and/or silicon nitride. The liner 132F may be in direct contact with sidewall(s) of the second spacer 141B of the dielectric stack 141, the thin film 142, and the capping layer 143.

In some embodiments, the semiconductor device 100 may further include functional structures over the functional region 100C. For example, the semiconductor device 100 may include black level correction (BLC) structure 172 and backside grounding 171. In some embodiments, at least a portion of the BLC structure 172 may be above the capping layer 143. In some embodiments, the backside grounding 171 penetrates the dielectric stack 141, the thin film 142, and the capping layer 143, and has a lower portion laterally surrounded by the device layer 103. However, it should be noted that the types of functional structures formed over the functional region 100C is not limited thereto. Other types of functional structures can be formed over the functional region 100C. For example, waveguide, grid structure, optical device, sensor, circuitry, fins, semiconductor device, or the like, can be formed over the functional region 100C.

In some embodiments, the semiconductor device 100 may further include a protection layer 181 covering the capping layer 143 over the terminal region 100A, the pixel region 100B, and the functional region 100C. The protection layer 181 may further cover the fins 152 and the BLC structure 172. In some embodiments, the protection layer 181 further covers a portion of the conductive layer 160. In some embodiments, at least a portion of the conductive pad 133 is exposed from the protection layer 181. In some embodiments, the protection layer 181 may include insulation material, such as oxide.

By utilizing the configuration of semiconductor device 100 in FIG. 1A to FIG. 1B as discussed above, the conductive pad 133 can be utilized as testing pad and/or a medium for applying bias voltage to the isolation structures 151. Specifically, testing operation can be performed during or after the fabrication operations (such as after exposing the conductive pad 133 from the protection layer 181) to detect the condition of the conductive routing 111 (e.g. electrical properties thereof, or whether the connection is proper) or other properties.

The isolation structures 151 can be utilized to alleviate crosstalk, dark current or white pixel issue. Furthermore, solder bumps (not shown) can be disposed above the conductive pad 133 and further connect the conductive pad 133 to a bias input. Since the isolation structures 151 may be electrically connected to the conductive pad 133 through the conductive layer 160, a bias voltage can thereby be applied to the isolation structures 151 through the conductive pad 133. By using conductive material in the isolation structures 151 and applying bias voltage (such as providing negative bias) thereto, the hole density in the portion of the device layer 103 around the isolation structures 151 can be increased, thereby alleviating dark current/leakage current and white pixel issue. Quantum efficiency may also thereby be improved by virtue of having a design of thicker device layer 103.

In addition, the aforesaid configuration allows bias voltage to be applied to the second group of isolation structures 151B through the first group of isolation structures 151A of the isolation structures 151 that may be in direct contact with the conductive layer 160. Alternatively stated, instead of having separated bias voltage input connected to separated isolation structures and apply bias voltage respectively, the aforesaid configuration of applying bias voltage to the second group of isolation structures 151B through the conductive layer 160 and the first group of isolation structures 151A helps achieving the minimization of the size of the semiconductor device 100.

Also, comparing to the comparative embodiment of forming additional dielectric layers proximal to a conductive pad, the present disclosure provide a structure where liner 132 is disposed between the conductive pad 133 and the device layer 103 (and/or dielectric stack 141, the thin film 142, and the capping layer 143), thereby improving adhesion and alleviate issues of seams generation or peeling.

Figure 1C:
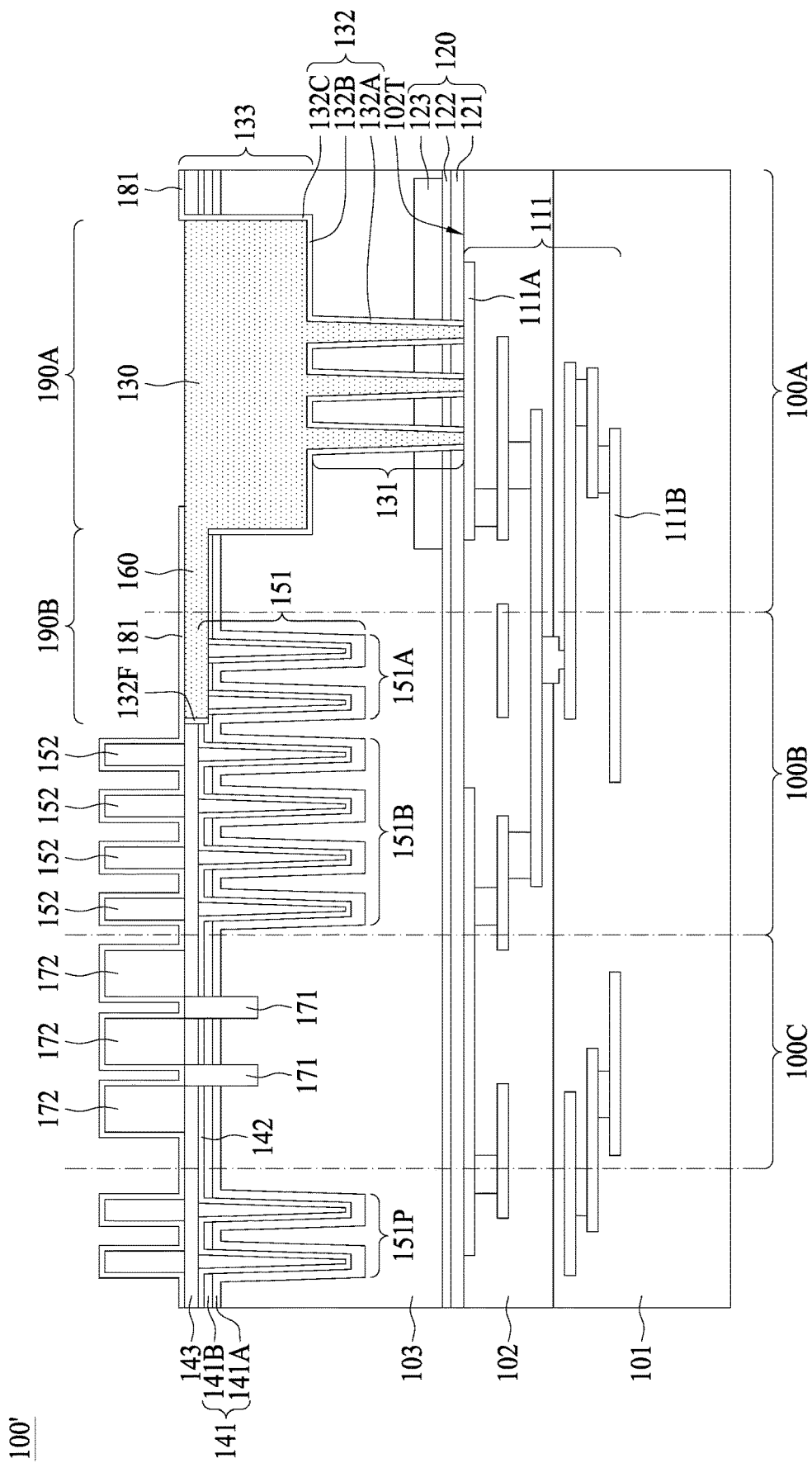
FIG. 1C is a cross sectional view of a semiconductor device, according to some embodiments of the present disclosure.

Referring to FIG. 1C, FIG. 1C is a cross sectional view of a semiconductor device, according to some embodiments of the present disclosure. The semiconductor device 100' is similar to the semiconductor device 100 discussed in FIG. 1A. The difference resides in that the conductive pad 133 of the semiconductor device 100' is made of a single material, such as aluminum copper, copper, or the like. Alternatively stated, the conductive pad 133, the conductive via(s) 131 and the conductive layer 160 may be made of same material, such as aluminum copper, copper, or the like.

Figure 2A:
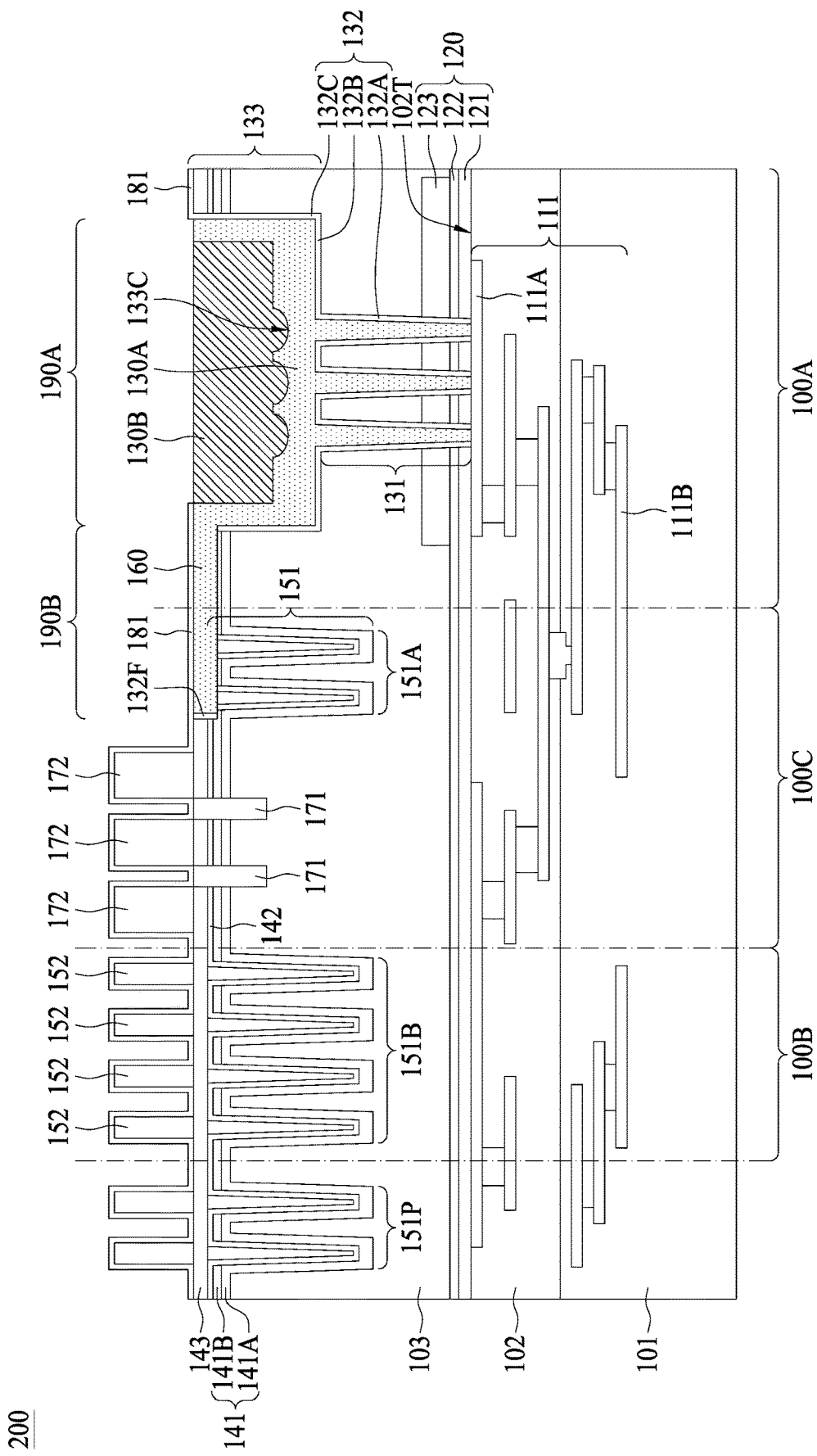
FIG. 2A is a cross sectional view of a semiconductor device, according to some embodiments of the present disclosure.
Figure 2B:
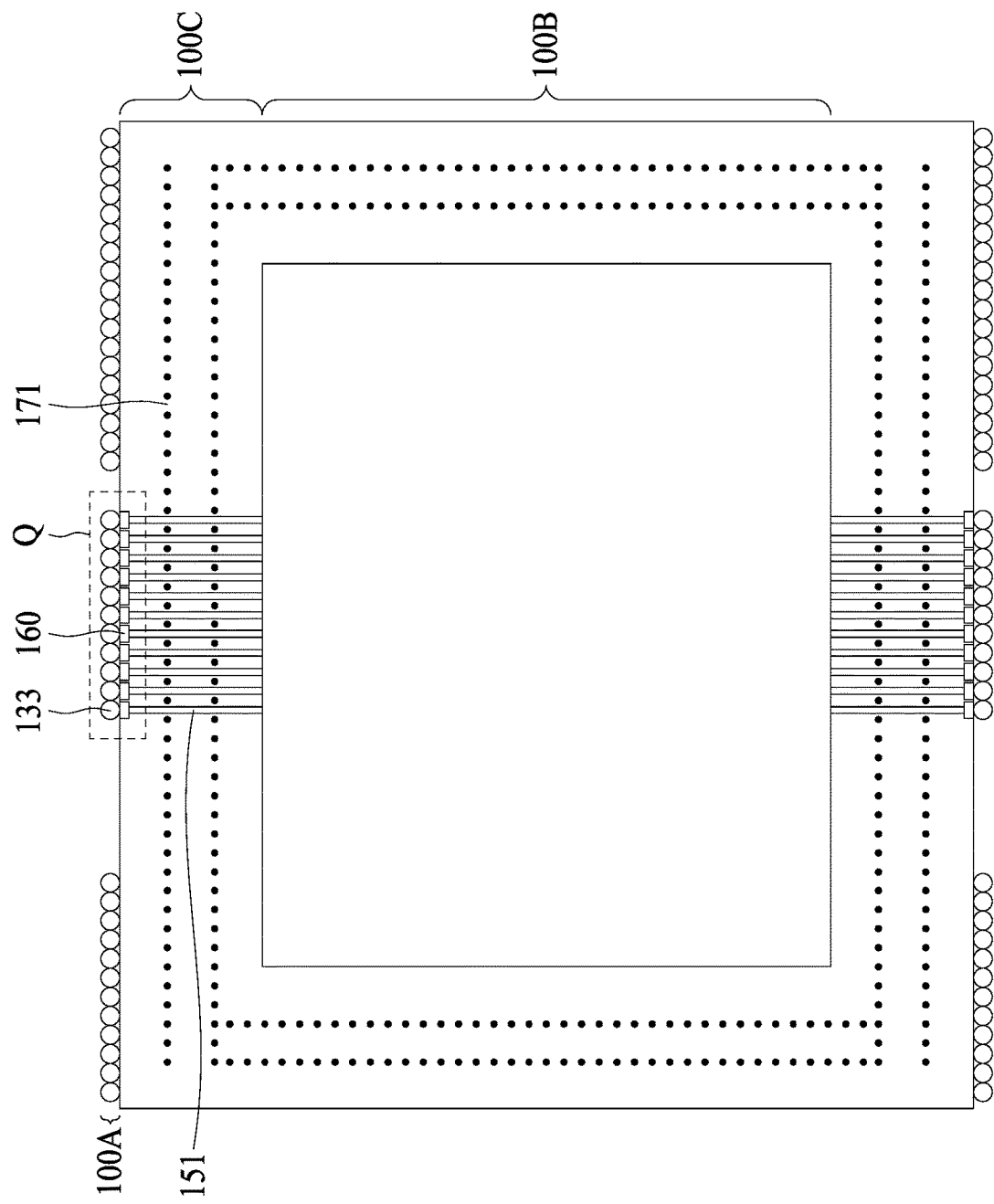
FIG. 2B is a schematic top view of the semiconductor device of FIG. 2A, according to some embodiments of the present disclosure.
Figure 2C:
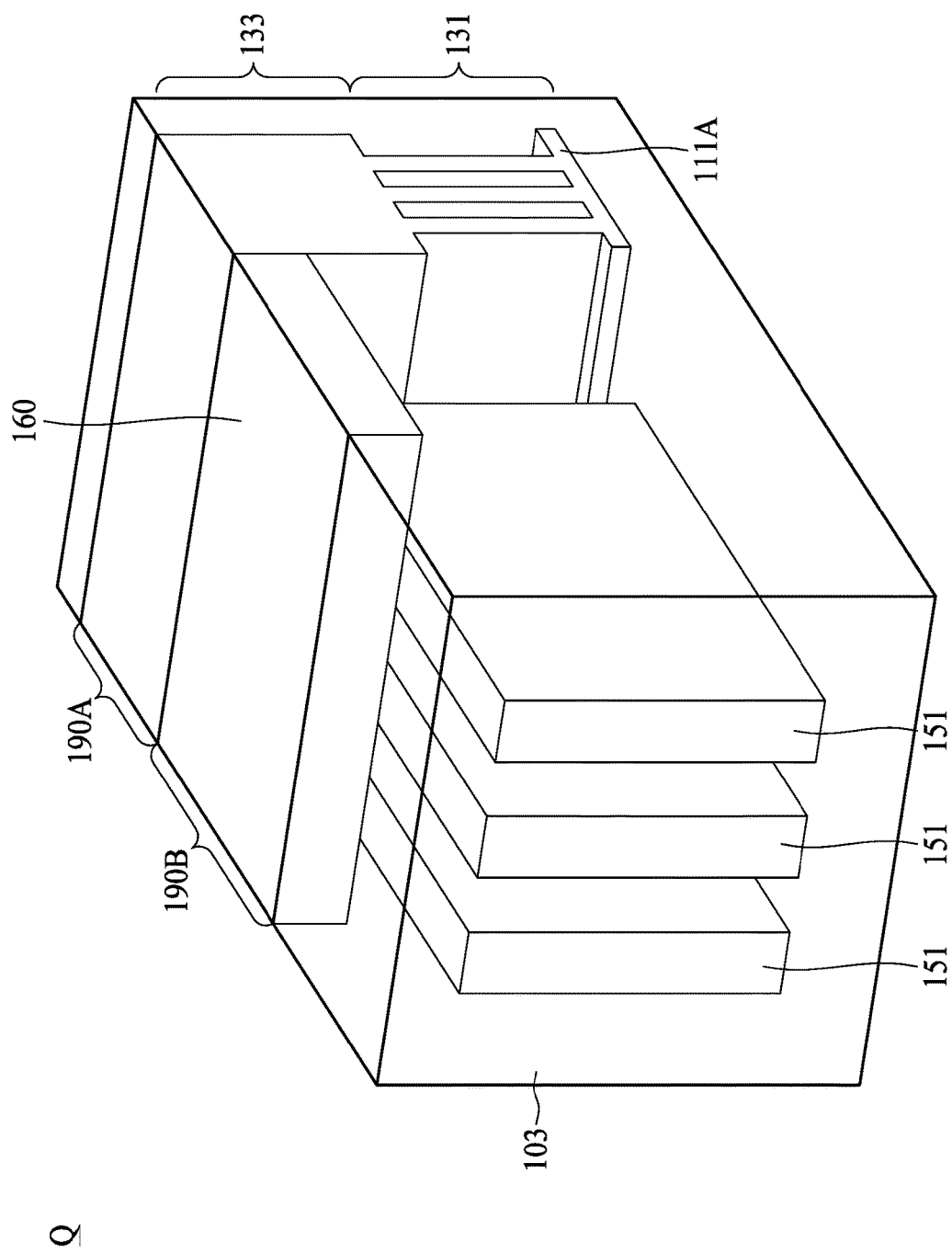
FIG. 2C is a schematic perspective view showing partially enlarged fragmentary diagrammatic views of portion Q of the semiconductor device of FIG. 2B, according to some embodiments of the present disclosure.

Referring to FIG. 2A to FIG. 2C, FIG. 2A is a cross sectional view of a semiconductor device, FIG. 2B is a schematic top view of the semiconductor device of FIG. 2A, FIG. 2C is a schematic perspective view showing partially enlarged fragmentary diagrammatic views of portion Q of the semiconductor device of FIG. 2B, according to some embodiments of the present disclosure. The semiconductor device 200 is similar to the semiconductor device 100 discussed in FIG. 1A. The difference resides in that the pixel region 100B of the semiconductor device 200 is apart from the terminal region 100A. In some embodiments, as shown in FIG. 2A to FIG. 2C, the functional region 100C can be disposed between the terminal region 100A and the pixel region 100B and proximal to the terminal region 100A. In order to apply bias voltage to the second group of isolation structures 151B in the pixel region 100B, the first group of isolation structures 151A can be disposed in the functional region 100C. Specifically, at least one or more isolation structure 151 from the first group of isolation structures 151A is connected to the conductive layer 160. In some embodiments, one or more isolation structure 151 from the first group of isolation structures 151A may be under a coverage of a vertical projection of the conductive layer 160. In some embodiments, at least one or more isolation structure 151 from the first group of isolation structures 151A in the functional region 100C is electrically connected to the at least one or more isolation structure 151 from the second group of isolation structures 151B, such that the second group of isolation structures 151B can be applied with the bias voltage through the path of conductive pad 133, the conductive layer 160, and the first group of isolation structures 151A. Alternatively stated, the conductive layer 160 extends from the terminal region 100A into the functional region 100C, and the conductive path from the conductive pad 133 to the second group of isolation structures 151B may extends from the functional region 100C to the pixel region 100B. In some examples shown in FIG. 2C, the conductive path from the conductive pad 133 to the second group of isolation structures 151B may be below a top surface of the device layer 103. However, in some alternative embodiments, the conductive path from the conductive pad 133 to the second group of isolation structures 151B may be include routing proximal to a top surface of the capping layer 143.

Figure 2D:
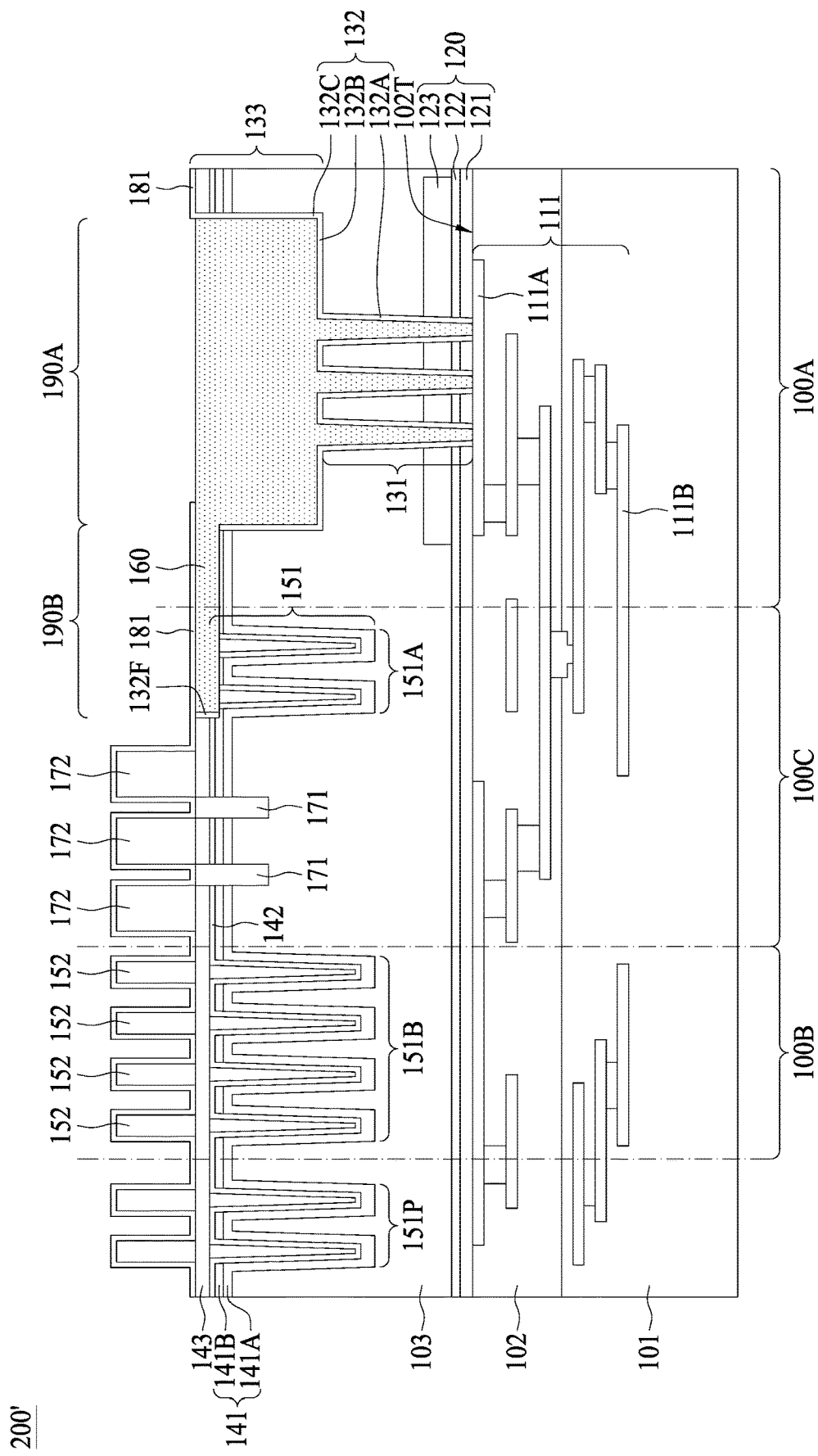
FIG. 2D is a cross sectional view of a semiconductor device, according to some embodiments of the present disclosure.

Referring to FIG. 2D, FIG. 2D is a cross sectional view of a semiconductor device, according to some embodiments of the present disclosure. The semiconductor device 200' is similar to the semiconductor device 200 discussed in FIG. 2A. The difference resides in that the conductive pad 133 of the semiconductor device 200' is made of a single material, such as aluminum copper, copper, or the like, which is similar to the embodiments discussed in FIG. 1C. Alternatively stated, the conductive pad 133, the conductive via(s) 131 and the conductive layer 160 may be made of same material, such as aluminum copper, copper, or the like.

Figure 3A:
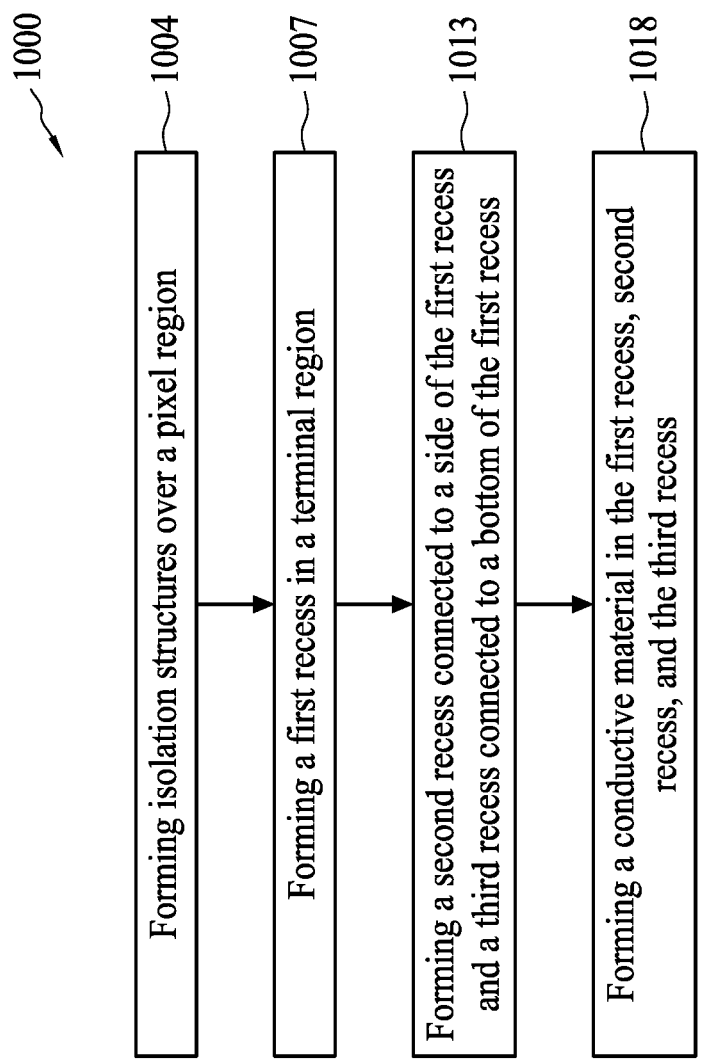
FIG. 3A shows a flow chart describing a method for fabricating a semiconductor device, in accordance with some embodiments of the present disclosure.

Referring to FIG. 3A, FIG. 3A shows a flow chart describing a method for fabricating a semiconductor device, in accordance with some embodiments of the present disclosure. The method 1000 for fabricating a semiconductor device includes forming isolation structures over a pixel region (operation 1004, which can be referred to FIG. 5 to FIG. 8), forming a first recess in a terminal region (operation 1007, which can be referred to FIG. 10), forming a second recess connected to a side of the first recess and a third recess connected to a bottom of the first recess (operation 1013, which can be referred to FIG. 11 and FIG. 12), and forming a conductive material in the first recess, second recess, and the third recess (operation 1018, which can be referred to FIG. 15A to FIG. 15C, or FIG. 16A to FIG. 16B).

Figure 3B:
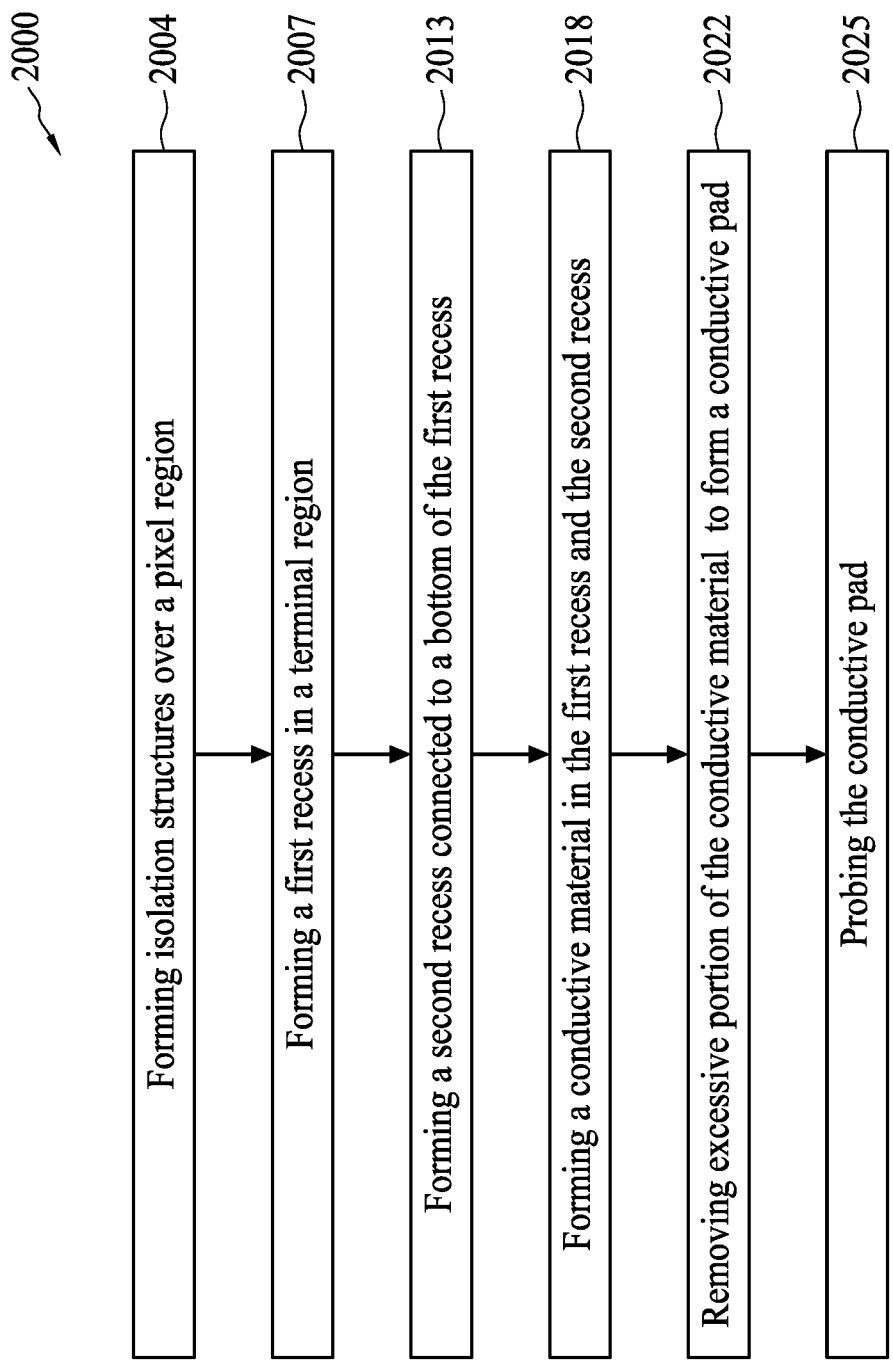
FIG. 3B shows a flow chart describing a method for fabricating a semiconductor device, in accordance with some embodiments of the present disclosure.

Referring to FIG. 3B, FIG. 3B shows a flow chart describing a method for fabricating a semiconductor device, in accordance with some embodiments of the present disclosure. The method 2000 for fabricating a semiconductor device includes forming isolation structures over a pixel region (operation 2004, which can be referred to FIG. 5 to FIG. 8), forming a first recess in a terminal region of the semiconductor portion (operation 2007, which can be referred to FIG. 10), forming a second recess connected to a bottom of the first recess (operation 2013, which can be referred to FIG. 12), forming a conductive material in the first recess and the second recess (operation 2018, which can be referred to FIG. 15A to FIG. 15B, or FIG. 16A), removing excessive portion of the conductive material to form a conductive pad (operation 2022, which can be referred to FIG. 15C or FIG. 16B), and probing the conductive pad (operation 2025).

Figure 3C:
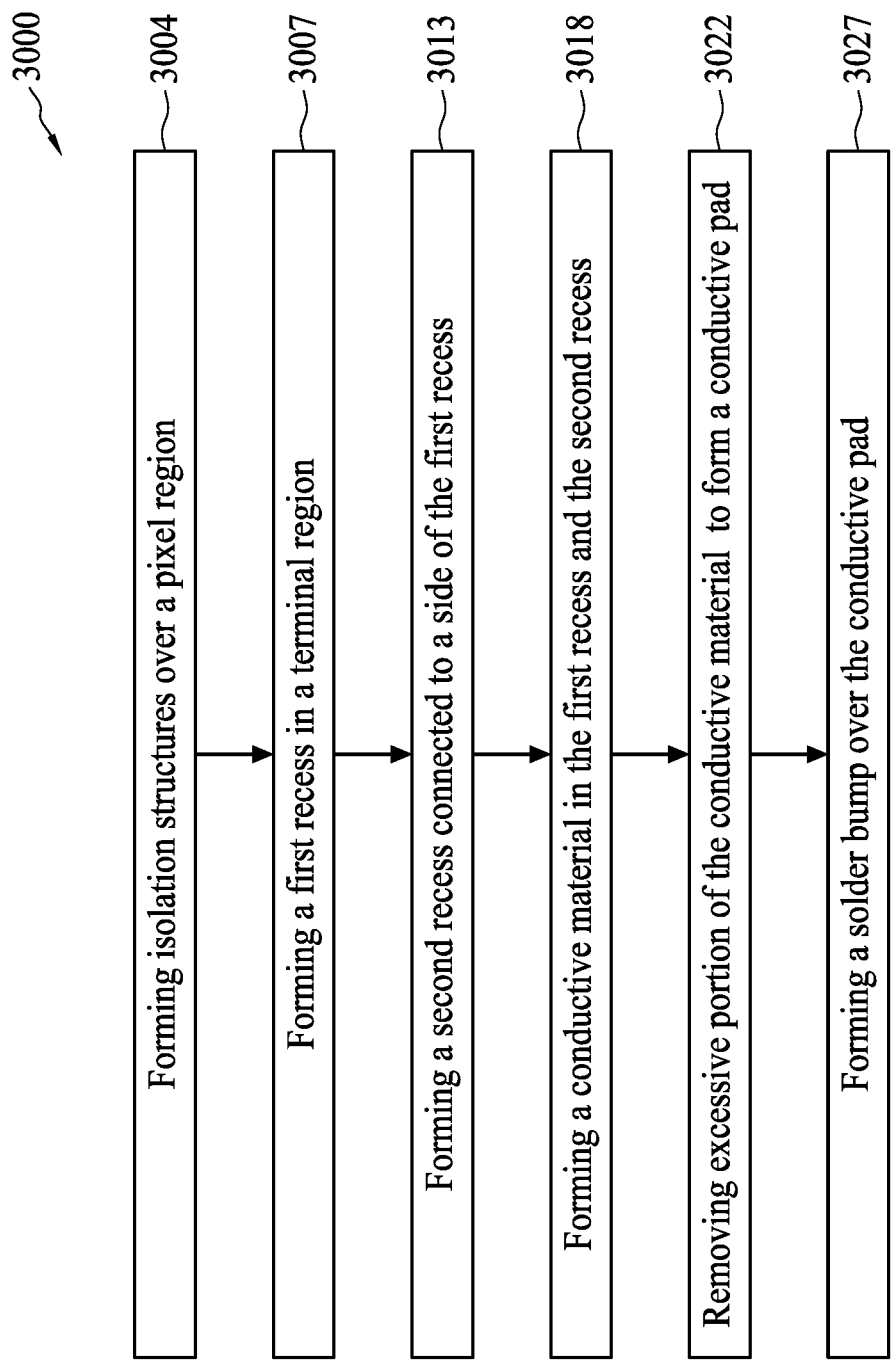
FIG. 3C shows a flow chart describing a method for fabricating a semiconductor device, in accordance with some embodiments of the present disclosure.

Referring to FIG. 3C, FIG. 3C shows a flow chart describing a method for fabricating a semiconductor device, in accordance with some embodiments of the present disclosure. The method 3000 for fabricating a semiconductor device includes forming isolation structures over a pixel region (operation 3004, which can be referred to FIG. 5 to FIG. 8), forming a first recess in a terminal region (operation 3007, which can be referred to FIG. 10), forming a second recess connected to a side of the first recess (operation 3013, which can be referred to FIG. 11), forming a conductive material in the first recess and the second recess (operation 3018, which can be referred to FIG. 15A to FIG. 15B, or FIG. 16A), removing excessive portion of the conductive material to form a conductive pad (operation 3022, which can be referred to FIG. 15C or FIG. 16B), and forming a solder bump over the conductive pad (operation 3027).

Figure 4:
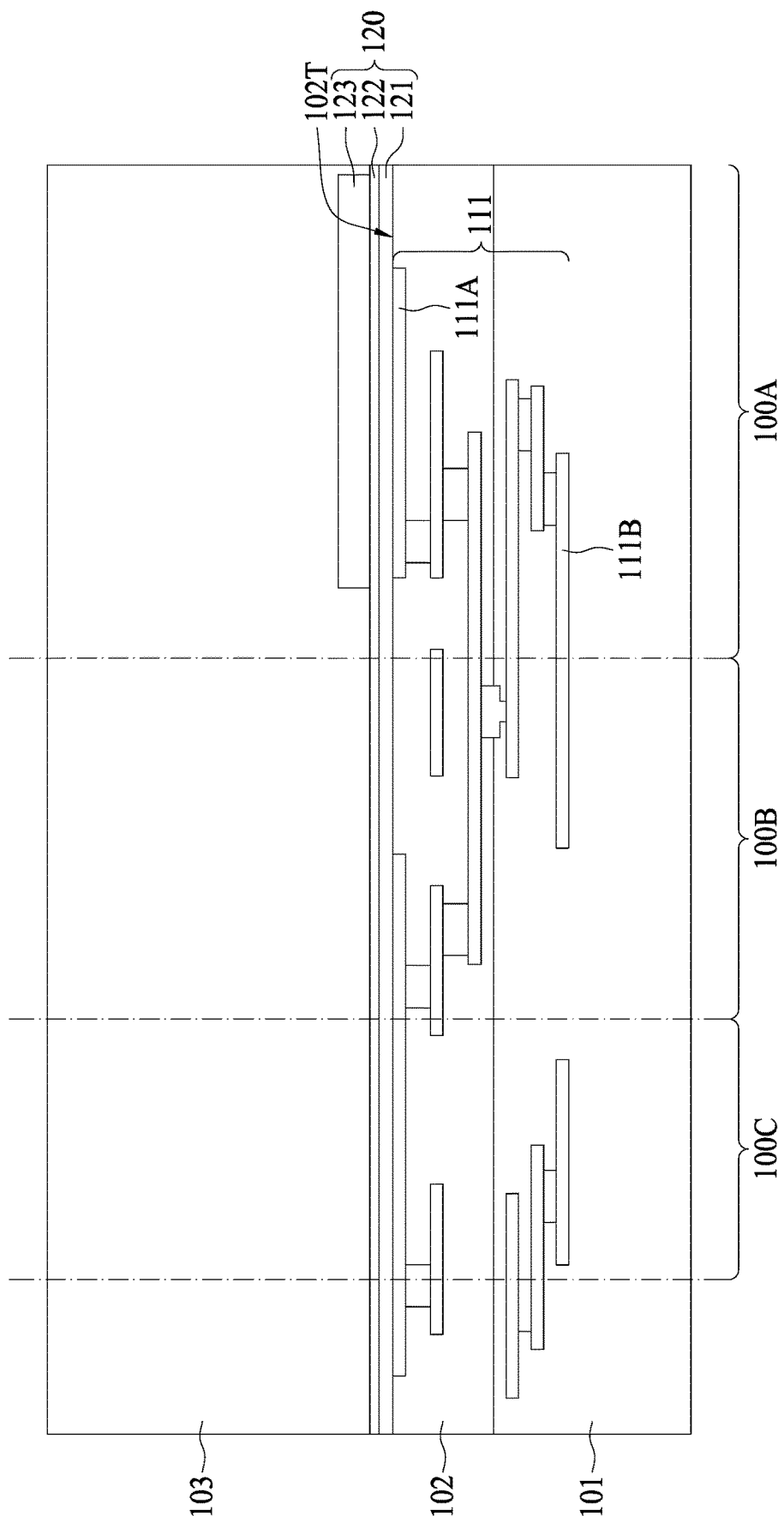
FIG. 4 to FIG. 14 are cross sectional views of a semiconductor device during intermediate stages of manufacturing operations, according to some embodiments of the present disclosure.

Referring to FIG. 4, FIG. 4 is across sectional view of a semiconductor device during intermediate stages of manufacturing operations, according to some embodiments of the present disclosure. A semiconductor portion 101 of a logic layer is provided. In some embodiments, the semiconductor portion 101 may include integrated circuits, such as Application Specific Integrated Circuit (ASIC). The semiconductor portion 101 and the device layer 103 may include a terminal region 100A, a pixel region 100B, and/or a functional region 100C. As discussed in FIG. 1A to FIG. 2D, the position of each regions can be adjusted based on certain design rule. In some of the embodiments discussed in FIG. 1A to FIG. 1C, the terminal region 100A may be adjacent to the pixel region 100B. In some alternative embodiments (as discussed in FIG. 2A to FIG. 2D), the functional region 100C may be adjacent to the terminal region 100A, and the pixel region 100B may be apart from the terminal region 100A.

A metallization portion 102, which may include insulating material, is formed over the semiconductor portion 101. A conductive routing 111 may be disposed in the semiconductor portion 101 and the metallization portion 102, wherein the conductive routing 111 includes a first metal line 111A in the metallization portion 102 and proximal to a top surface 102T of the metallization portion 102, and conductive features 111B in the semiconductor portion 101. The first metal line 111A and the conductive features 111B may be electronically connected. In some of the embodiments, the first metal line 111A may have a top surface coplanar with the top surface 102T of the metallization portion 102.

An insulating film stack 120 is formed over the metallization portion 102. In some of the embodiments, the insulating film stack 120 may include etch stop layer(s), for example, a first etch stop layer 121 and a second etch stop layer 122 over the first etch stop layer 121. However, the total amount of etch stop layers is not limited in the present disclosure. In some of the embodiments, the insulating film stack 120 may include isolation film 123 over the top surface 102T of the metallization portion 102 (or over the aforesaid etch stop layer(s) if presented). In some embodiments, the isolation film 123 may be made of insulation material that can be used as part of isolation trench, for example, oxide-based material or oxide-containing material. In some embodiments, a portion of the isolation film 123 is removed to expose a portion of the second etch stop layer 122 (or a top surface of the etch stop layer(s)). In some embodiments, the portions of isolation film 123 over the pixel region 100B and the functional region 100C are removed, and a portion of the isolation film 123 over the terminal region 100A is remained. Alternatively, the isolation film 123 is directly formed over the terminal region 100A.

A device layer 103 is formed above the top surface 102T of the metallization portion 102. In some embodiments, the device layer 103 may be silicon (either doped or undoped), or other materials that can be utilized as part of system-on-chip (SOC). In some embodiments, a planarization operation (such as chemical mechanical planarization operation) can be performed to reduce a thickness of the device layer 103 to a predetermined thickness.

Figure 5:
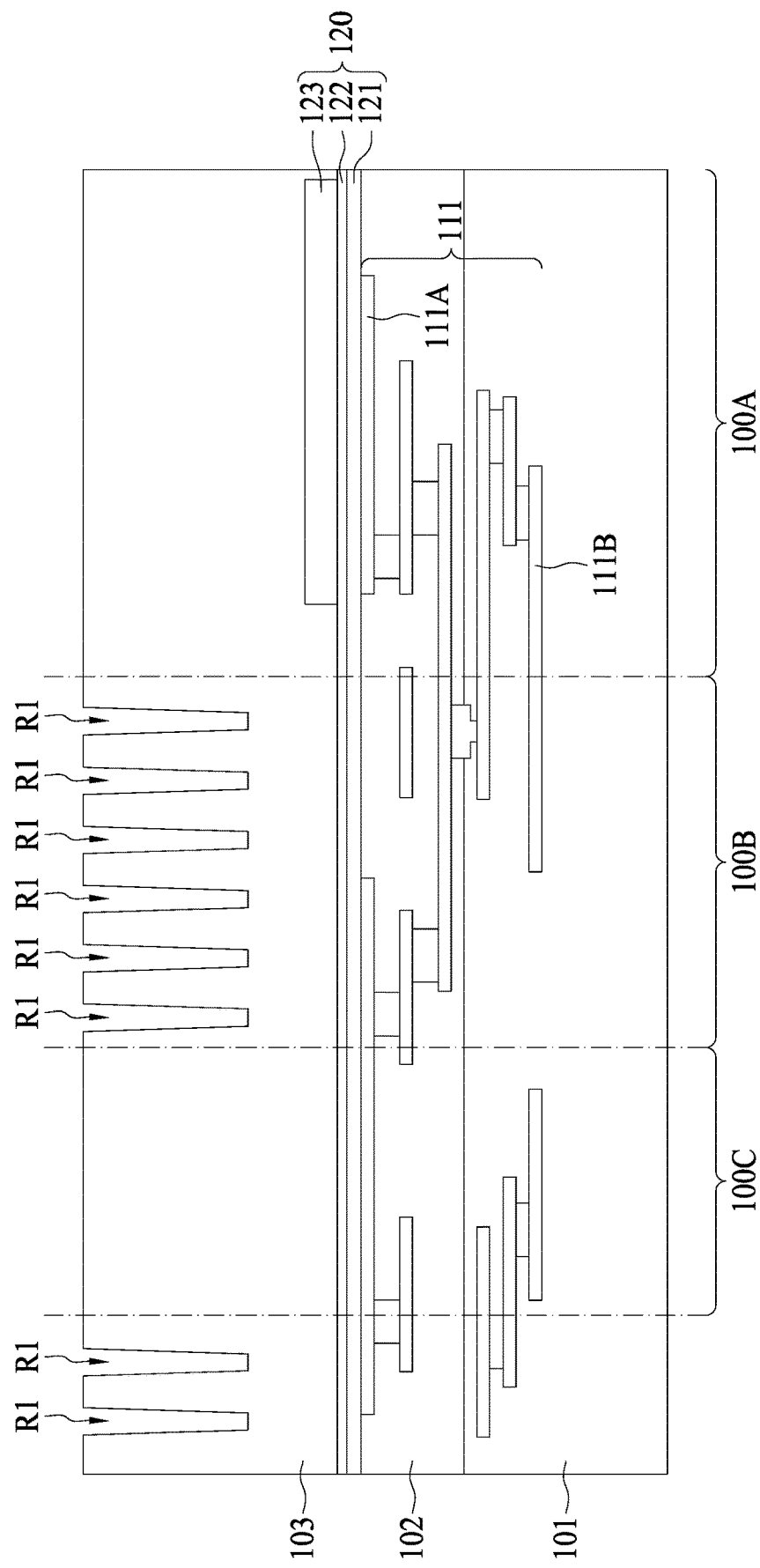

Referring to FIG. 5, FIG. 5 is across sectional view of a semiconductor device during intermediate stages of manufacturing operations, according to some embodiments of the present disclosure. In some embodiments, a plurality of first recess R1 is formed in the pixel region 100B by photolithography and/or etching operation. In some embodiments, regions different from the terminal region 100A and the functional region 100C can also be formed with first recess R1, but the present disclosure is not limited thereto. In some embodiments, the formation of the plurality of first recess R1 may include photolithography operation and/or etching operation.

Figure 6:
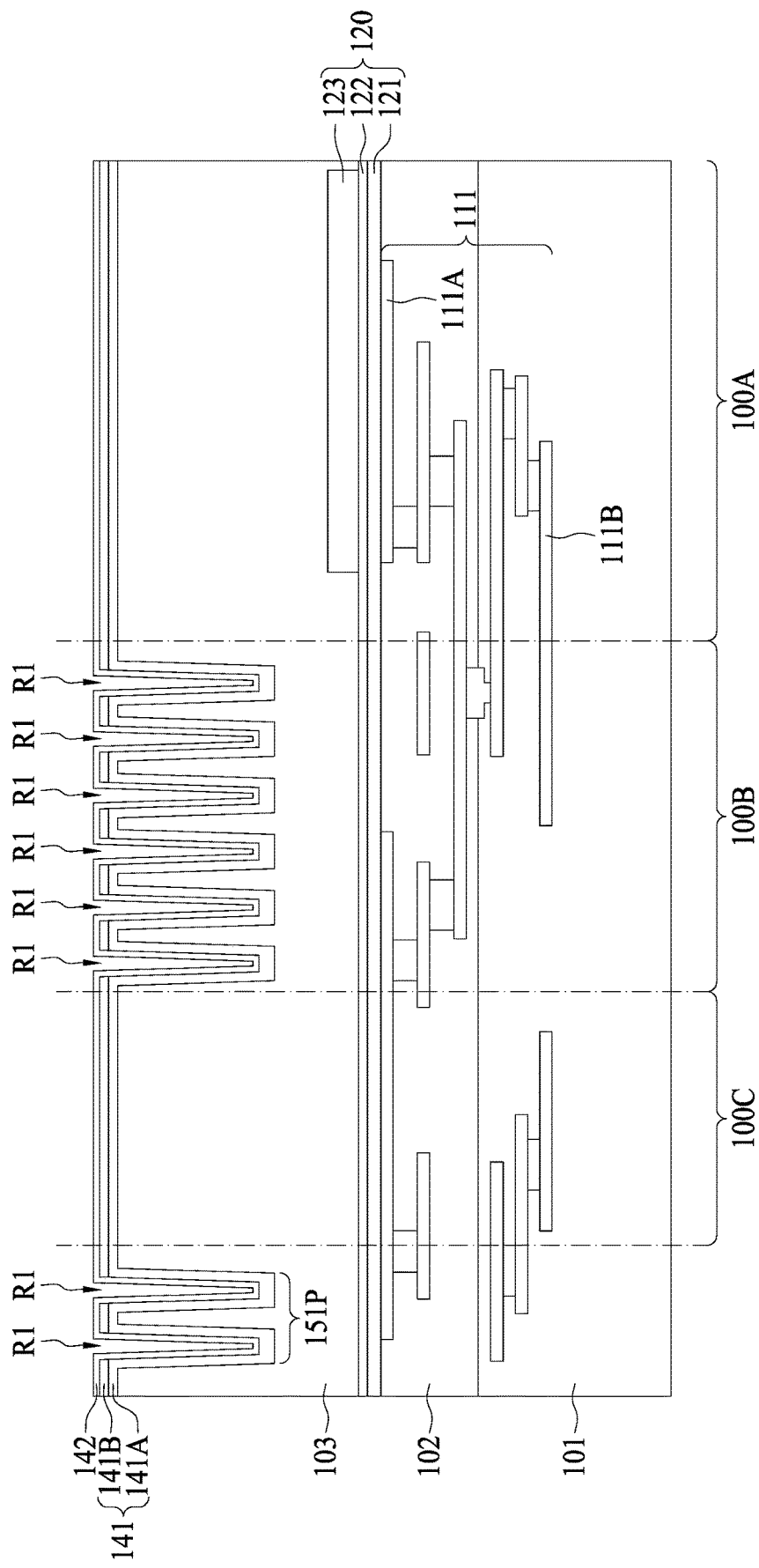

Referring to FIG. 6, FIG. 6 is across sectional view of a semiconductor device during intermediate stages of manufacturing operations, according to some embodiments of the present disclosure. A dielectric stack 141 is formed over the device layer 103. In some embodiments, the dielectric stack 141 may include a first spacer 141A and a second spacer 141B over the first spacer 141A. In some embodiments, a material of the dielectric stack 141 can include high-k materials. In some embodiments, the first spacer 141A may include aluminum oxide ($Al_xO_y$) and hafnium oxide ($Hf_xO_y$). In some embodiments, the second spacer 141B may include tantalum oxide ($Ta_xO_y$). In some embodiments, the first spacer 141A is formed in the first recess R1 and over the device layer 103, and subsequently the second spacer 141B is formed over the first spacer 141A. Photolithography and/or etching operation can be utilized to remove an excessive portion of the first spacer 141A in the first recess R1 and an excessive portion of the second spacer 141B above the first recess R1. In some alternative embodiments, the dielectric stack 141 may include one high-k layer. In some alternative embodiments, the dielectric stack 141 may include three or more high-k layer. In some alternative embodiments, accurate deposition (such as atomic layer deposition) can be utilized in forming the dielectric stack 141.

A thin film 142 is formed over the dielectric stack 141. In some embodiments, the thin film may include oxide. The thin film 142 may be formed by using atomic layer deposition (ALD), plasma enhanced oxide deposition operation, and/or other fabrication operations that has relatively higher thickness accuracy. A portion of thin film 142 may be formed in the first recess R1 and lining at an inner sidewall of the dielectric stack 141. The thin film 142 further covers the top surface of the dielectric stack 141. In some embodiments, a liner 144 is formed in each of the first recess R1 over the inner sidewall of the thin film 142. In some embodiments, the liner 144 may include titanium aluminum (TiAl) or other suitable material. In some embodiments, a thickness of the liner 144 may be in a range from about substantially 0 Angstrom to about 40 Angstrom.

Figure 7:
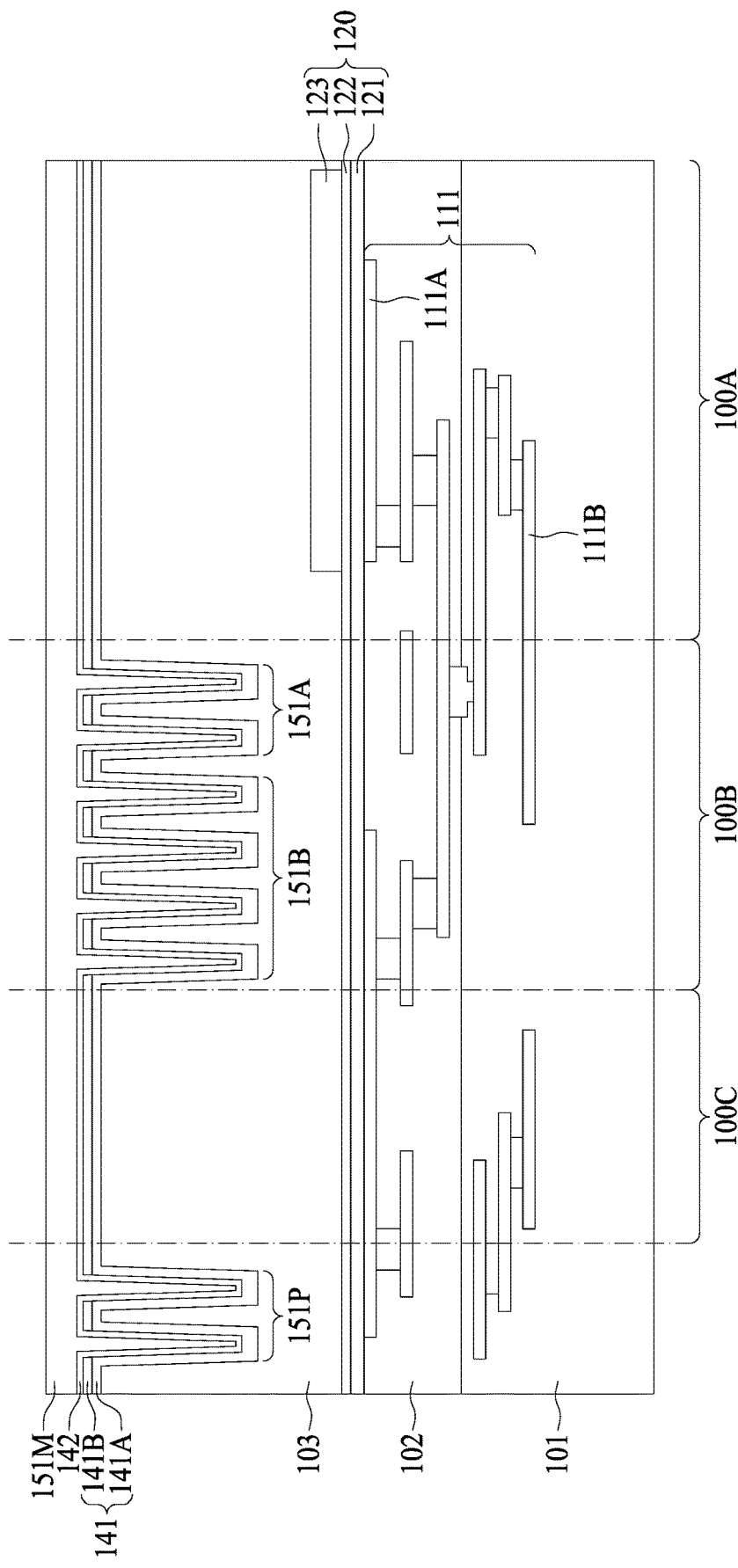

Referring to FIG. 7, FIG. 7 is across sectional view of a semiconductor device during intermediate stages of manufacturing operations, according to some embodiments of the present disclosure. A conductive material 151M is formed in the plurality of first recess R1 and further covers the top surface of the thin film 142. In some embodiments, the conductive material 151M may be aluminum or other suitable material.

Figure 8:
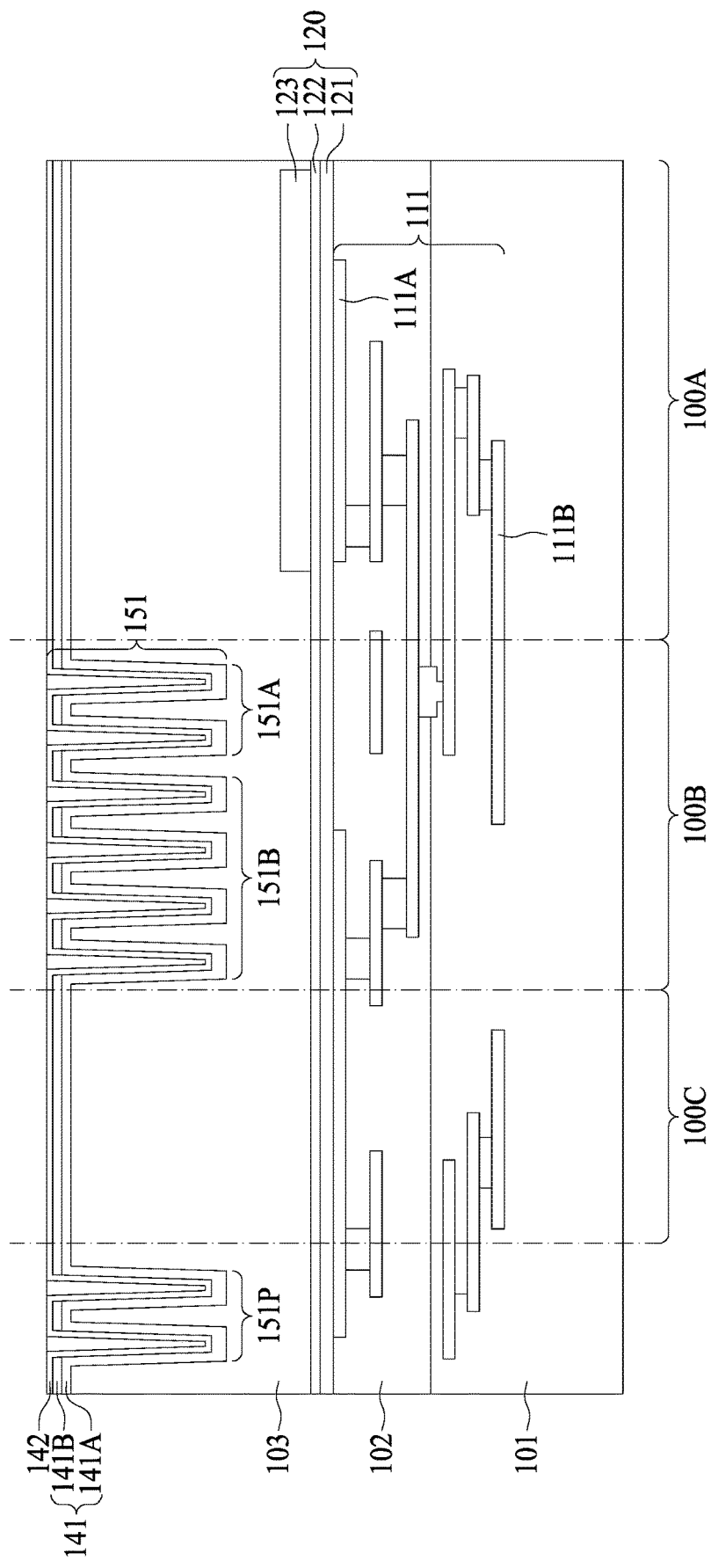

Referring to FIG. 8, FIG. 8 is across sectional view of a semiconductor device during intermediate stages of manufacturing operations, according to some embodiments of the present disclosure. A planarization operation (such as chemical mechanical planarization operation) is performed to remove excessive portion of the conductive material 151M, thereby forming a plurality of isolation structures 151 (which may include the first group of isolation structures 151A and the second group of isolation structures 151B) in the first recess R1 (shown in FIG. 6). In some embodiments, the planarization operation stops at the thin film 142. In some embodiments, a thickness of the thin film is reduced by the planarization operation. The criticality of a height D2 of each of the isolation structures 151 can be referred to aforementioned FIG. 1A to FIG. 1B.

It should be noted that, additional routing of the isolation structure 151 may be formed to connect between the first group of isolation structures 151A and the second group of isolation structures 151B.

Figure 9:
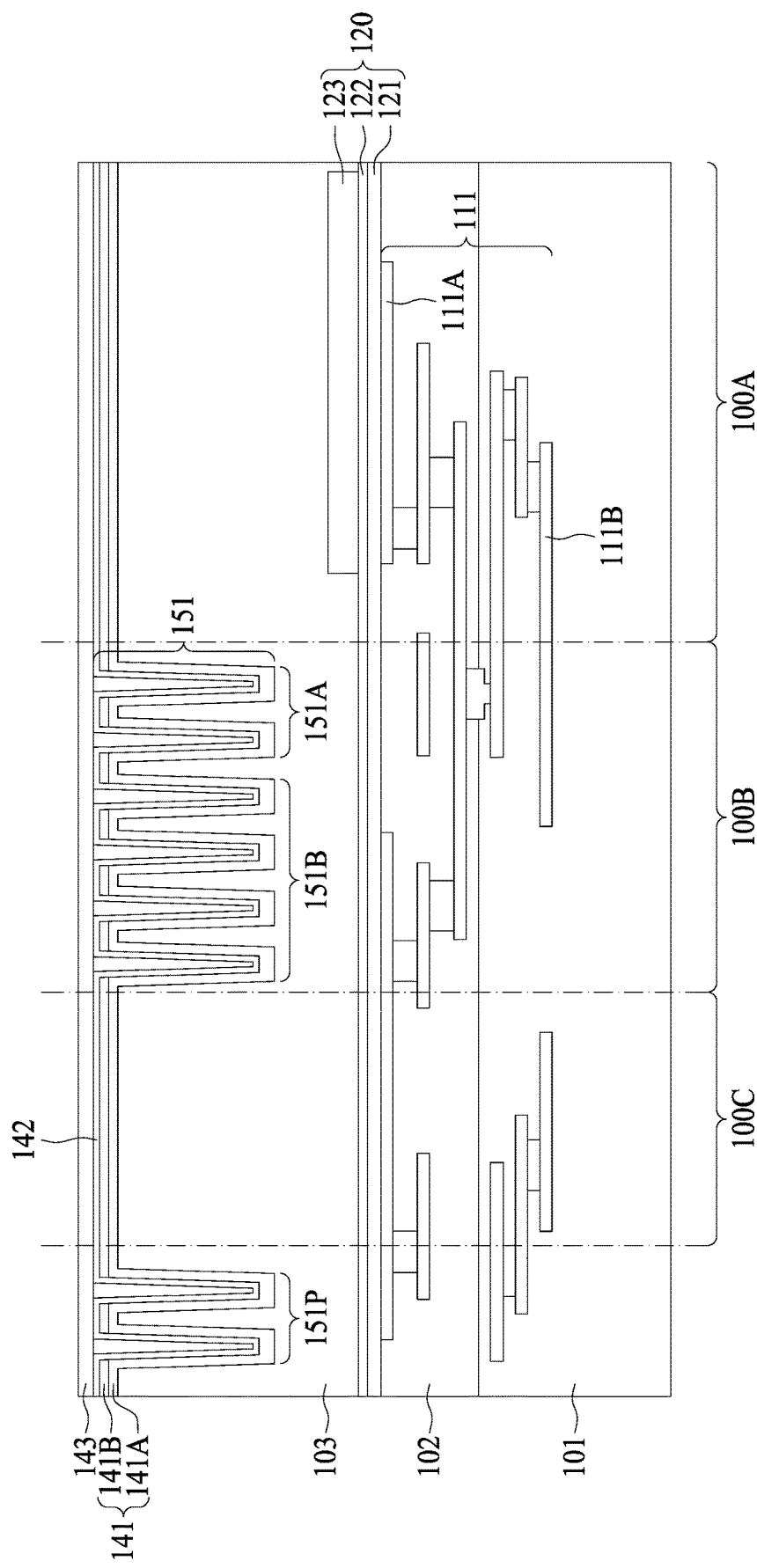

Referring to FIG. 9, FIG. 9 is across sectional view of a semiconductor device during intermediate stages of manufacturing operations, according to some embodiments of the present disclosure. A capping layer 143 is formed over the thin film 142 and the isolation structures 151 (which may include the first group of isolation structures 151A and the second group of isolation structures 151B). In some embodiments, the capping layer 143 may include oxide, which can be formed by low pressure radical oxidation operation (LPRO) or other suitable operations.

Figure 10:
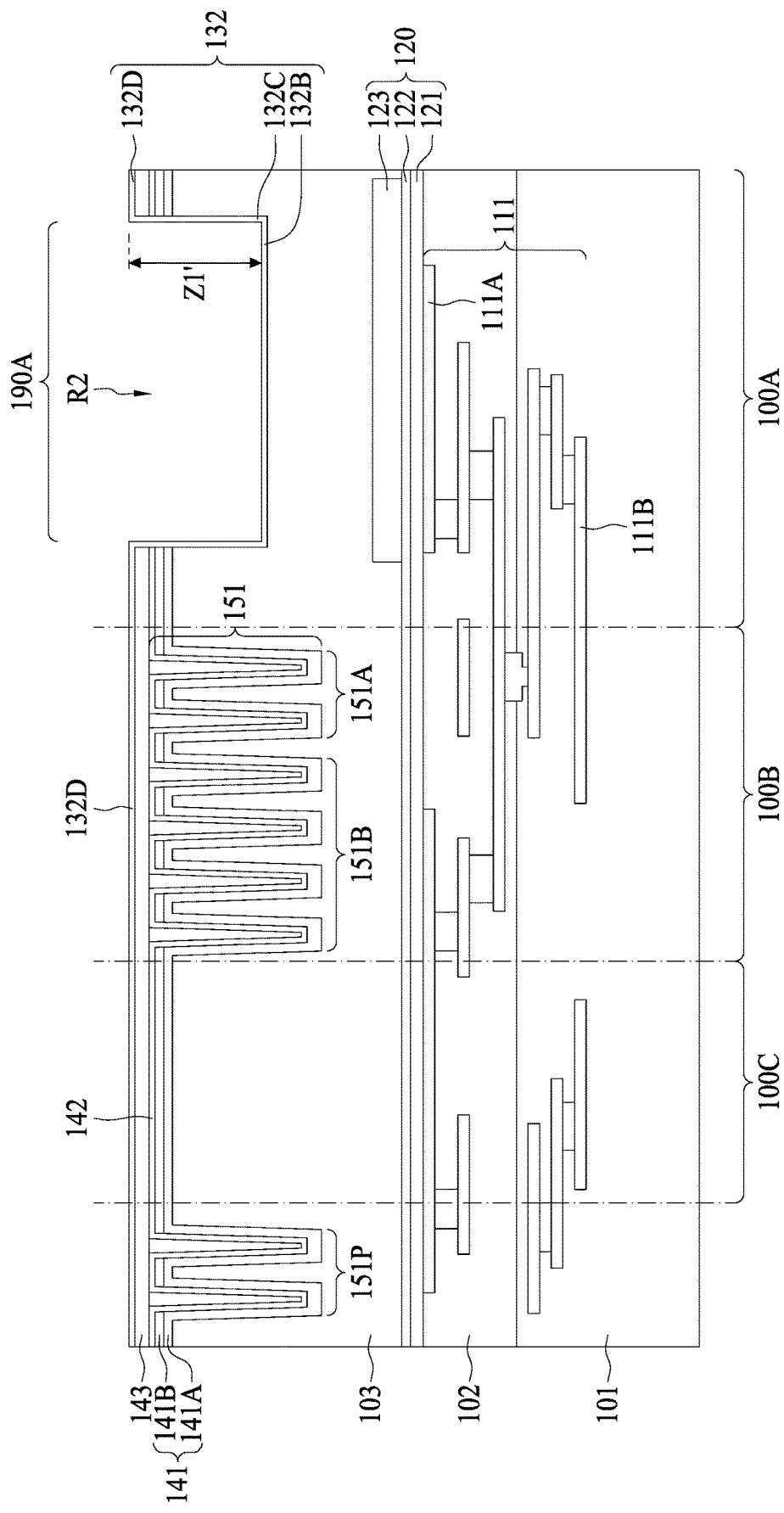

Referring to FIG. 10, FIG. 10 is across sectional view of a semiconductor device during intermediate stages of manufacturing operations, according to some embodiments of the present disclosure. A second recess R2 is formed in the terminal region 100A and occupies a first area 190A. The second recess R2 may be formed by photolithography and/or etching operation. In some embodiments, the depth Z1' of the second recess R2 is in a range from about 12,000 Angstrom to about 28,000 Angstrom. If the depth Z1' is less than the aforesaid range, the reliability issue of the conductive pad 133 (subsequently discussed in FIG. 15D or FIG. 16C) may occur. If the depth Z1' is greater than the aforesaid range, it may deviate from the purpose of scaling down dimensional size of the semiconductor device. A liner 132 is formed over the exposed surface of the second recess R2 and a top surface of the capping layer 143. In some embodiments, a material of the liner 132 may be oxide and/or silicon nitride, or other suitable material. Herein a portion of the liner 132 conforming the bottom of the second recess R2 is referred to as the second portion 132B of the liner 132, a portion of the liner 132 conforming the sidewall of the second recess R2 is referred to as the third portion 132C of the liner 132. In some embodiments, the liner 132 may further include a fourth portion 132D over the top surface of the capping layer 143.

Figure 11:
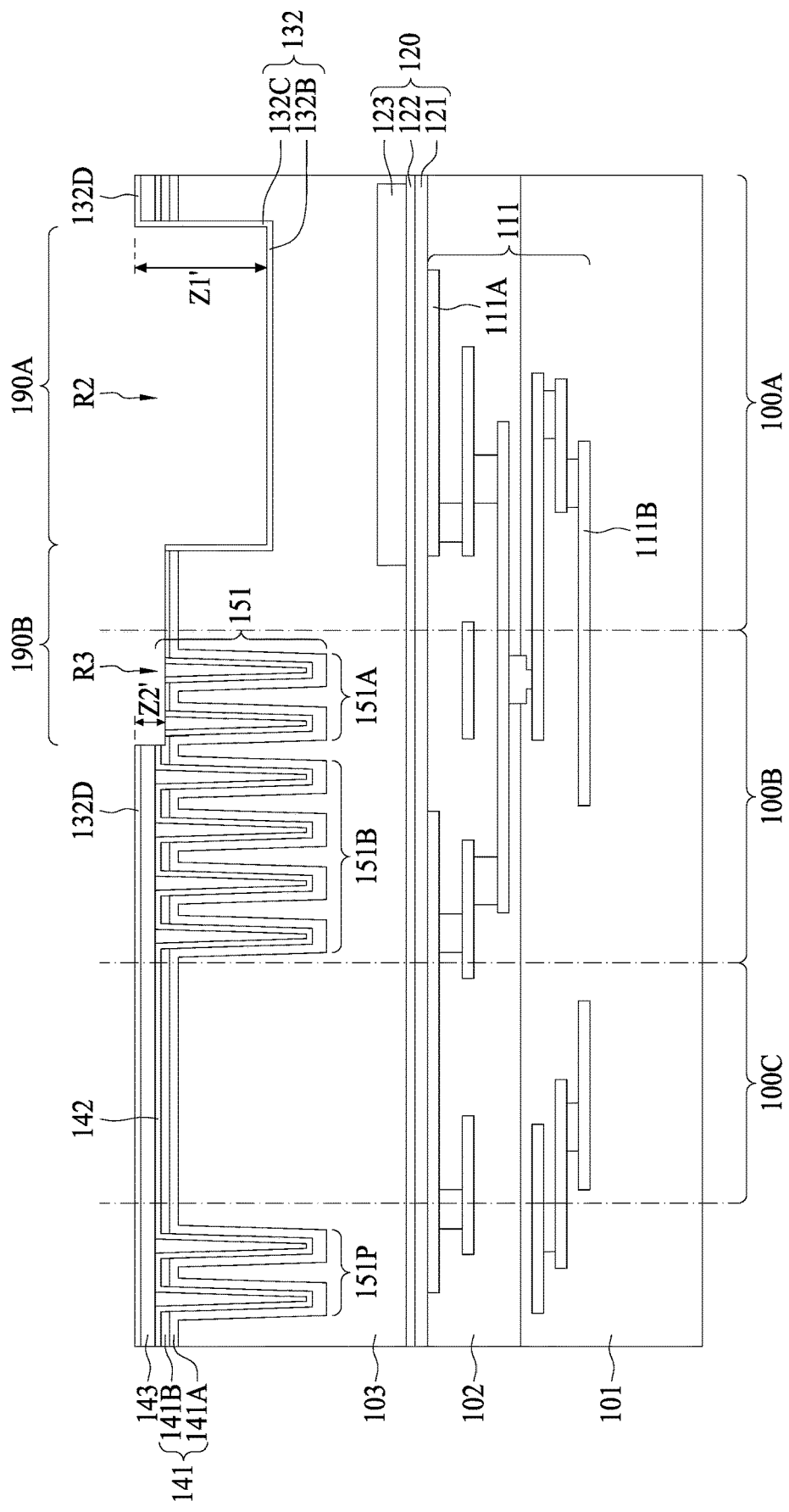

Referring to FIG. 11, FIG. 11 is across sectional view of a semiconductor device during intermediate stages of manufacturing operations, according to some embodiments of the present disclosure. A third recess R3 is formed in a position adjacent to the second recess R2. In some embodiments, the third recess R3 connects with a side of the second recess R2. In some embodiments, the third recess R3 occupies the second area 190B, which extends from the terminal region 100A to the pixel region 100B. In some embodiments, the third recess R3 is formed by photolithography and/or etching operation, wherein such removal operation may stop at the dielectric stack 141, such as stopping at the second spacer 141B. In some embodiments, a portion of the liner 132, a portion of the capping layer 143, a portion of the thin film 142 and a portion of the second spacer 141B may be removed in such removal operation. A top surface of each of the first group of isolation structures 151A is exposed at the bottom of the third recess R3. In the embodiments of the removal operation stops at the second spacer 141B, the top surface of each of the first group of isolation structures 151A is exposed from the second spacer 141B. In some of the embodiments, the second group of isolation structures 151B is free from being exposed by the removal operation. Alternatively stated, a portion of the isolation structures 151 is exposed while another portion of the isolation structures 151 free from being exposed after the removal operation, wherein such configuration may be achieved by utilizing masks or photoresist.

A depth Z2' of the third recess R3 is less than a depth Z1' of the second recess R2. In some embodiments, the depth Z2' of the third recess R3 is in a range from around 500 Angstrom to about 2,000 Angstrom. If the depth Z2' is less than the aforesaid range, the reliability issue of the conductive layer 160 (subsequently discussed in FIG. 15D or FIG. 16C) may occur, or, the resistivity may be increased. If the depth Z2' is greater than the aforesaid range, it may deviate from the purpose of scaling down dimensional size of the semiconductor device.

Figure 12:
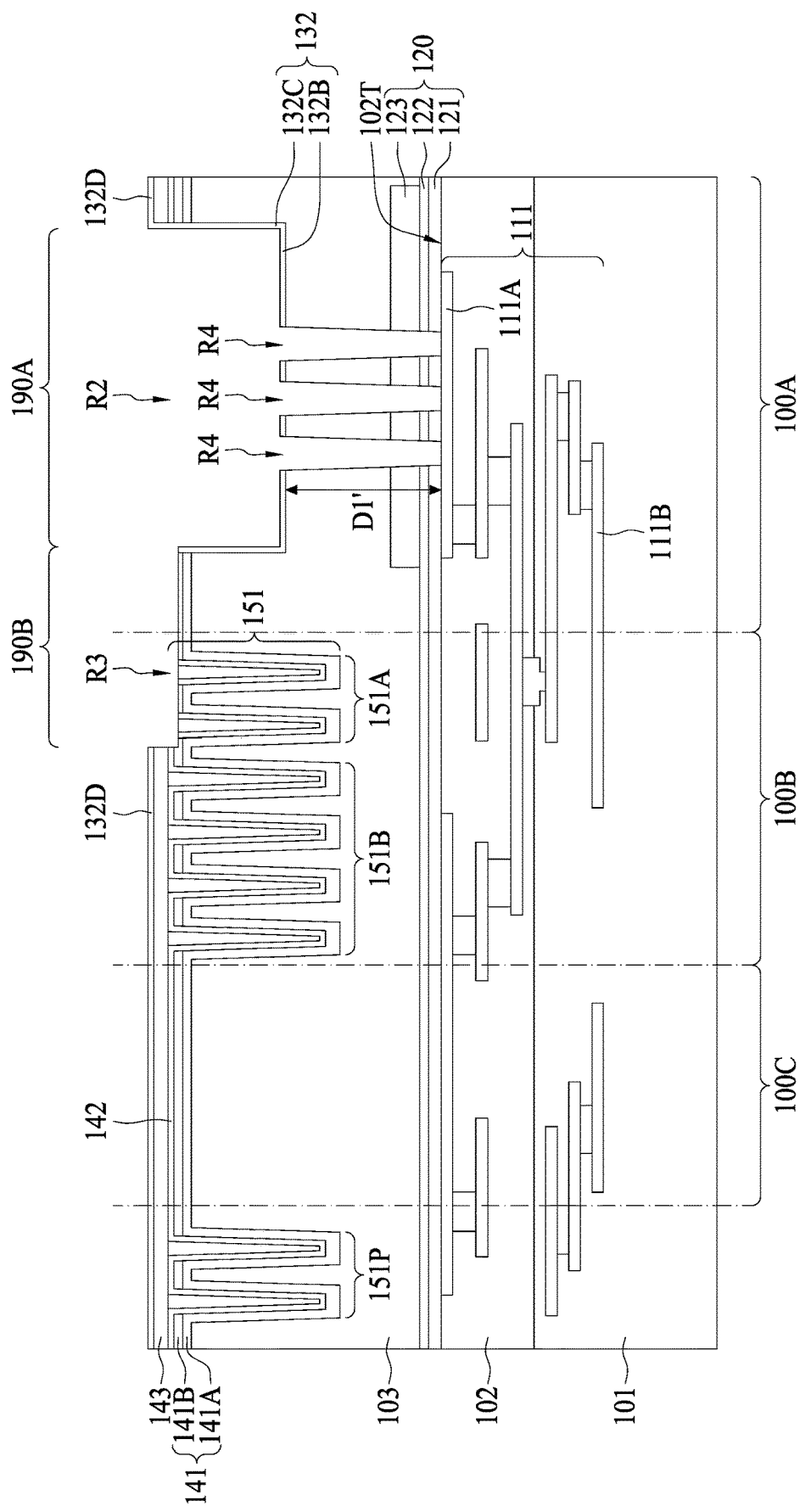

Referring to FIG. 12, FIG. 12 is across sectional view of a semiconductor device during intermediate stages of manufacturing operations, according to some embodiments of the present disclosure. One or more fourth recess R4 is formed at the bottom of the second recess R2. A portion of the conductive routing 111, such as a top surface of the first metal line 111A proximal to a top surface 102T of the metallization portion 102, is exposed from the fourth recess R4. In some embodiments, the insulating film stack 120 may be utilized to control the accuracy of formation of fourth recess R4. In some embodiments, a portion of the second portion 132B of the liner 132 is removed during the formation of the fourth recess R4. A height D1' of the fourth recess R4 may be in a range from about 3 μm to about 10 μm. If the height D1' is greater than the aforesaid range, the conductive material filling therein (which will be discussed in FIG. 15A or FIG. 16A) may become difficult. If the height D1' is less than the aforesaid range, and the device layer 103 directly above the conductive routing 111 may be too thin, which may cause breakdown or other types of reliability issues.

Figure 13:
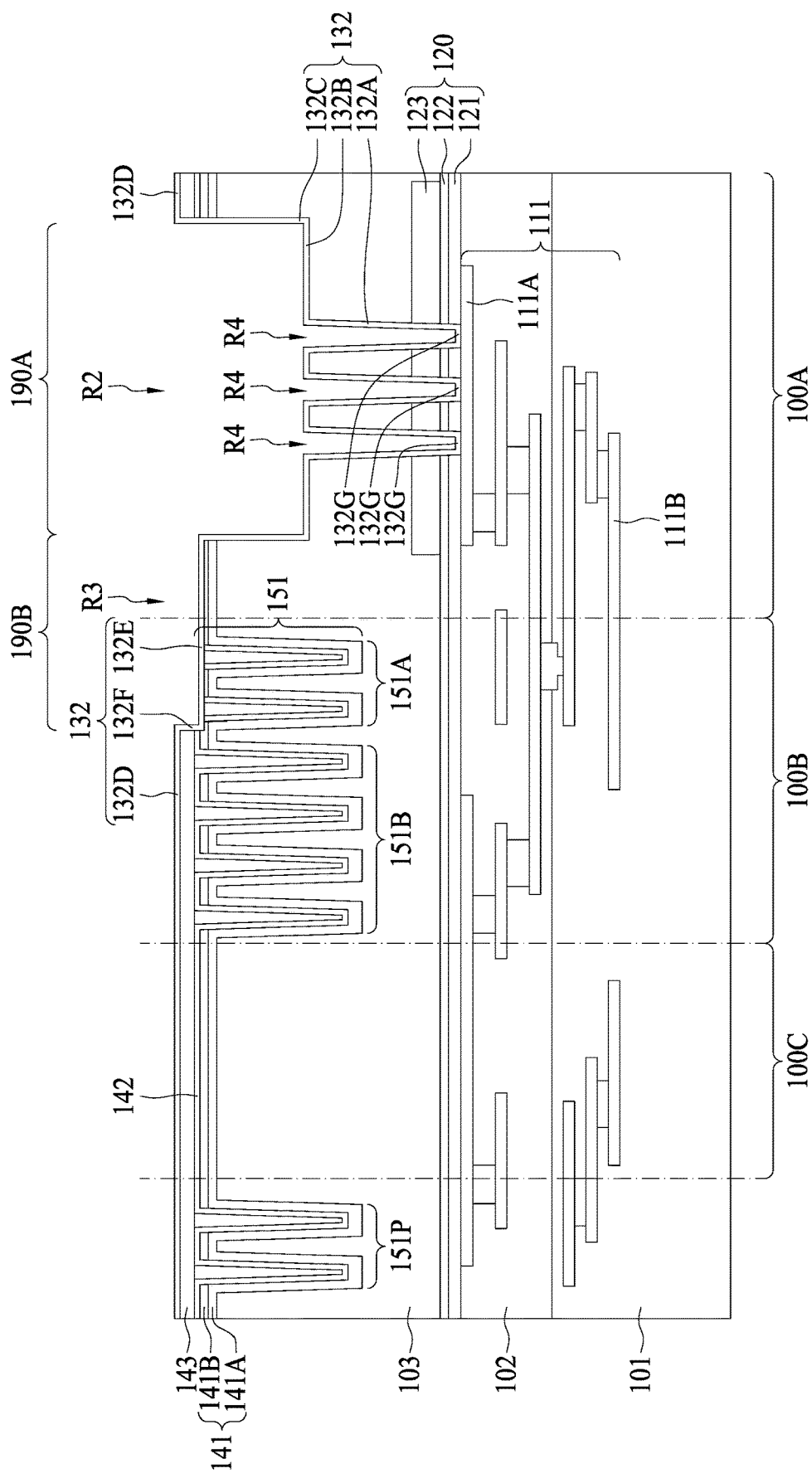

Referring to FIG. 13, FIG. 13 is across sectional view of a semiconductor device during intermediate stages of manufacturing operations, according to some embodiments of the present disclosure. The material of liner 132 is formed to conform to a profile of the second recess R2, the third recess R3 and the fourth recess R4. In some embodiments, a material of the liner 132 may be oxide and/or silicon nitride, or other suitable material. Specifically, after forming the additional material of liner 132 in the second recess R2, the third recess R3 and the fourth recess R4, the liner 132 includes a first portion 132A conforming the sidewalls of the fourth recess R4, a second portion 132B conforming a bottom surface of the second recess R2, a third portion 132C conforming the sidewalls of the second recess R2, a fourth portion 132D over the top surface of the capping layer 143, a fifth portion 132E conforming a bottom surface of the third recess R3, sixth portion 132F lining at a sidewall of the third recess R3, and a seventh portion 132G lining at a bottom of the fourth recess R4.

Figure 14:
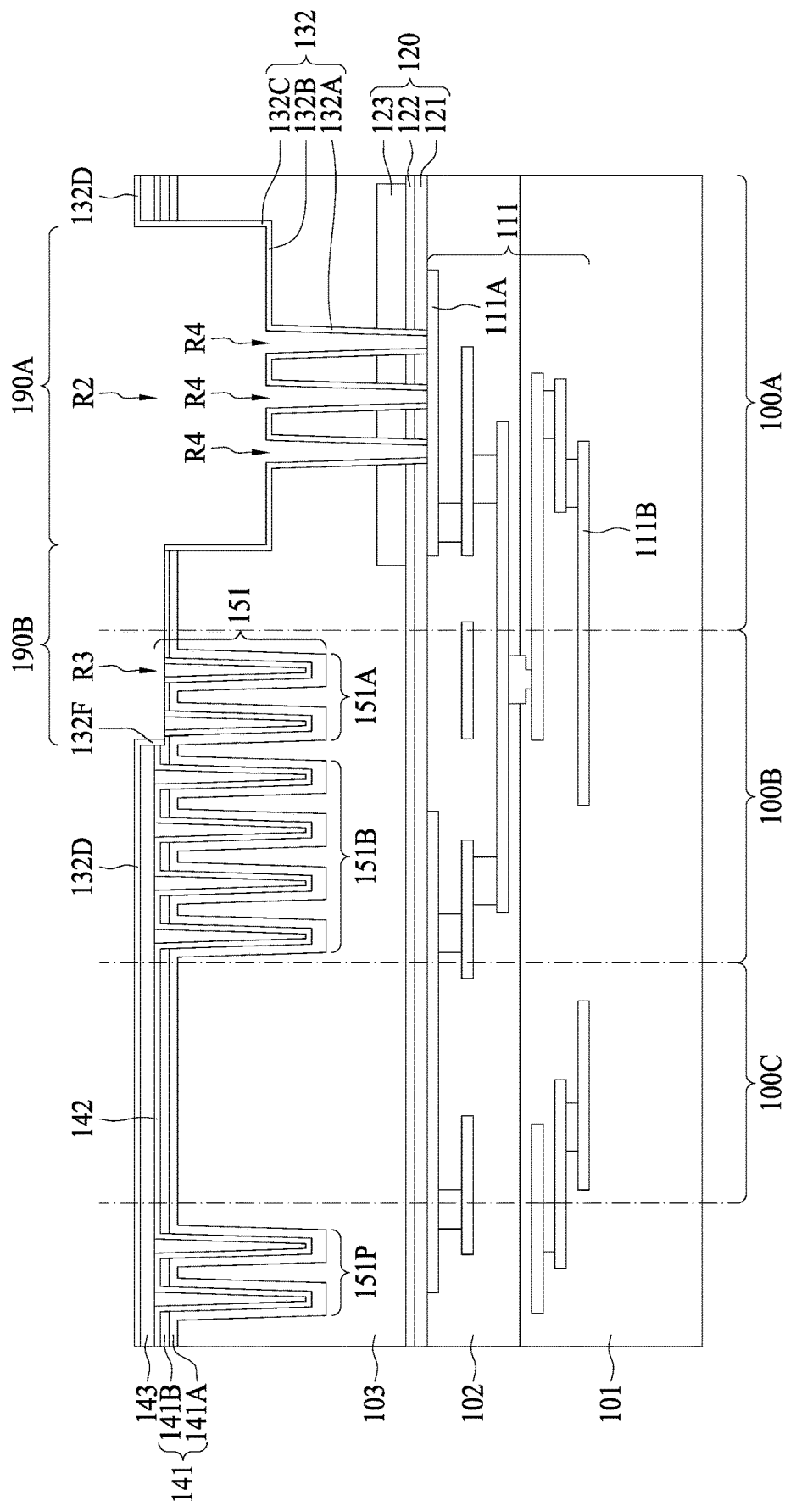

Referring to FIG. 14, FIG. 14 is across sectional view of a semiconductor device during intermediate stages of manufacturing operations, according to some embodiments of the present disclosure. The fifth portion 132E of the liner 132 conforming the bottom surface of the third recess R3 and the seventh portion 132G lining at a bottom of the fourth recess R4 (which are shown in FIG. 13) are removed. In some embodiments, such removal may include anisotropic etching, dry etching, wet etching, selective etching, or other suitable operation. A top surface of the first metal line 111A and a top surface of the first group of isolation structures 151A may be thereby exposed. In some embodiments, a top surface of the second spacer 141B is thereby exposed.

The operations discussed in FIG. 15A to FIG. 15D and FIG. 16A to FIG. 16C can respectively be performed after the operation discussed in FIG. 4 to FIG. 14. Method for fabricating semiconductor device 100 discussed in FIG. 1A (or alternatively semiconductor device 200 discussed in FIG. 2A) is discussed in FIG. 15A to FIG. 15D, and method for fabricating semiconductor device 100' discussed in FIG. 1C (or alternatively semiconductor device 200' discussed in FIG. 2D) is discussed in FIG. 16A to FIG. 16C.

Figure 15A:
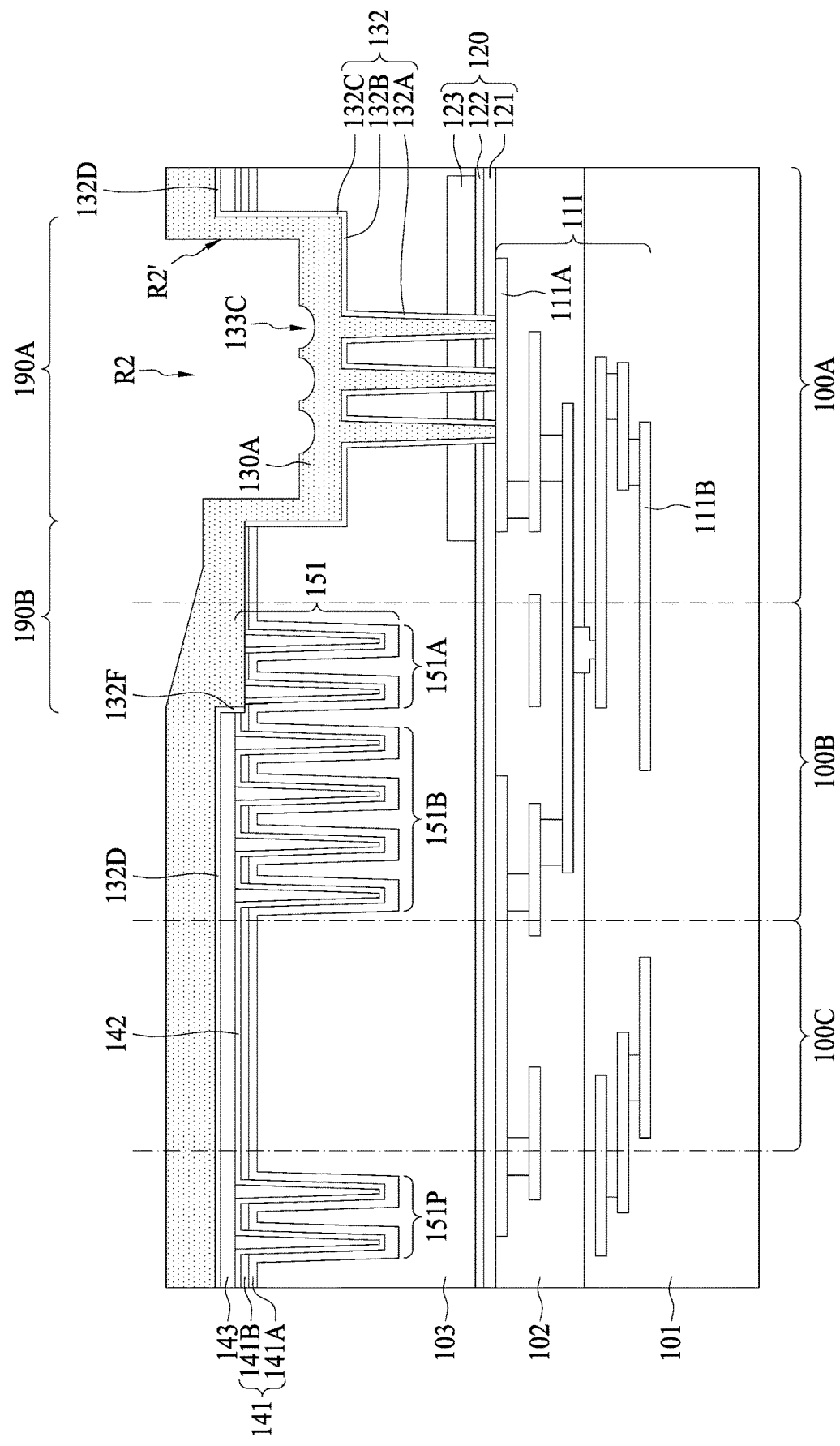
FIG. 15A to FIG. 15D are cross sectional views of a semiconductor device during intermediate stages of manufacturing operations, according to some embodiments of the present disclosure.

Referring to FIG. 15A, FIG. 15A is across sectional view of a semiconductor device during intermediate stages of manufacturing operations, according to some embodiments of the present disclosure. A conductive material layer 130A is formed in the third recess R3 and the fourth recess R4 (shown in FIG. 14). In some embodiments, the conductive material layer 130A further covers and conforms the fourth portion 132D of the liner 132. In some embodiments, the conductive material layer 130A is formed by chemical vapor deposition (CVD). In some of the embodiments, the conductive material layer 130A occupies a portion of the second recess R2, for example, the conductive material layer 130A conforms the sidewall and the bottom surface of the second recess R2. In some embodiments, the conductive material layer 130A may have a concaved surface 133C proximal to the bottom surface of the second recess R2. In some embodiments, the conductive material layer 130A may have an inner sidewall R2'. In some embodiments, the conductive material layer 130A can include copper, aluminum copper or other suitable material.

Figure 15B:
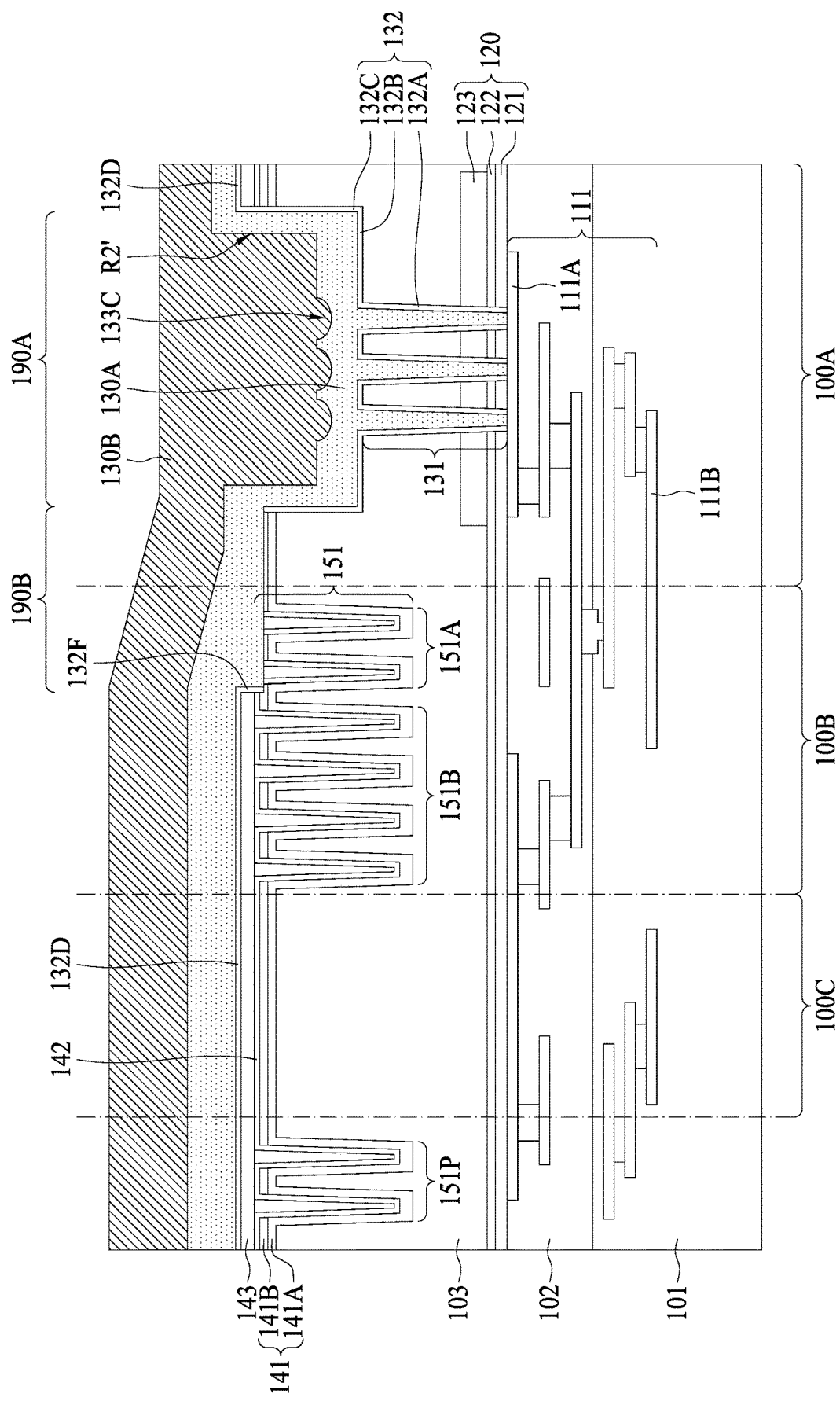

Referring to FIG. 15B, FIG. 15B is across sectional view of a semiconductor device during intermediate stages of manufacturing operations, according to some embodiments of the present disclosure. A conductive material layer 130B is formed over the conductive material layer 130A. In the embodiments, the conductive material layer 130B is different from the conductive material layer 130A. In some embodiments, the conductive material layer 130A is formed by physical vapor deposition (PVD). In some embodiments, the conductive material layer 130B can include aluminum copper or other suitable material. In some embodiments, the conductive material layer 130B is in direct contact with the concaved surface 133C and the inner sidewall R2' of the conductive material layer 130A. In some embodiments, a top surface of the conductive material layer 130B in the first area 190A may be lower than a top surface of the conductive material layer 130B over the functional region 100C.

Figure 15C:
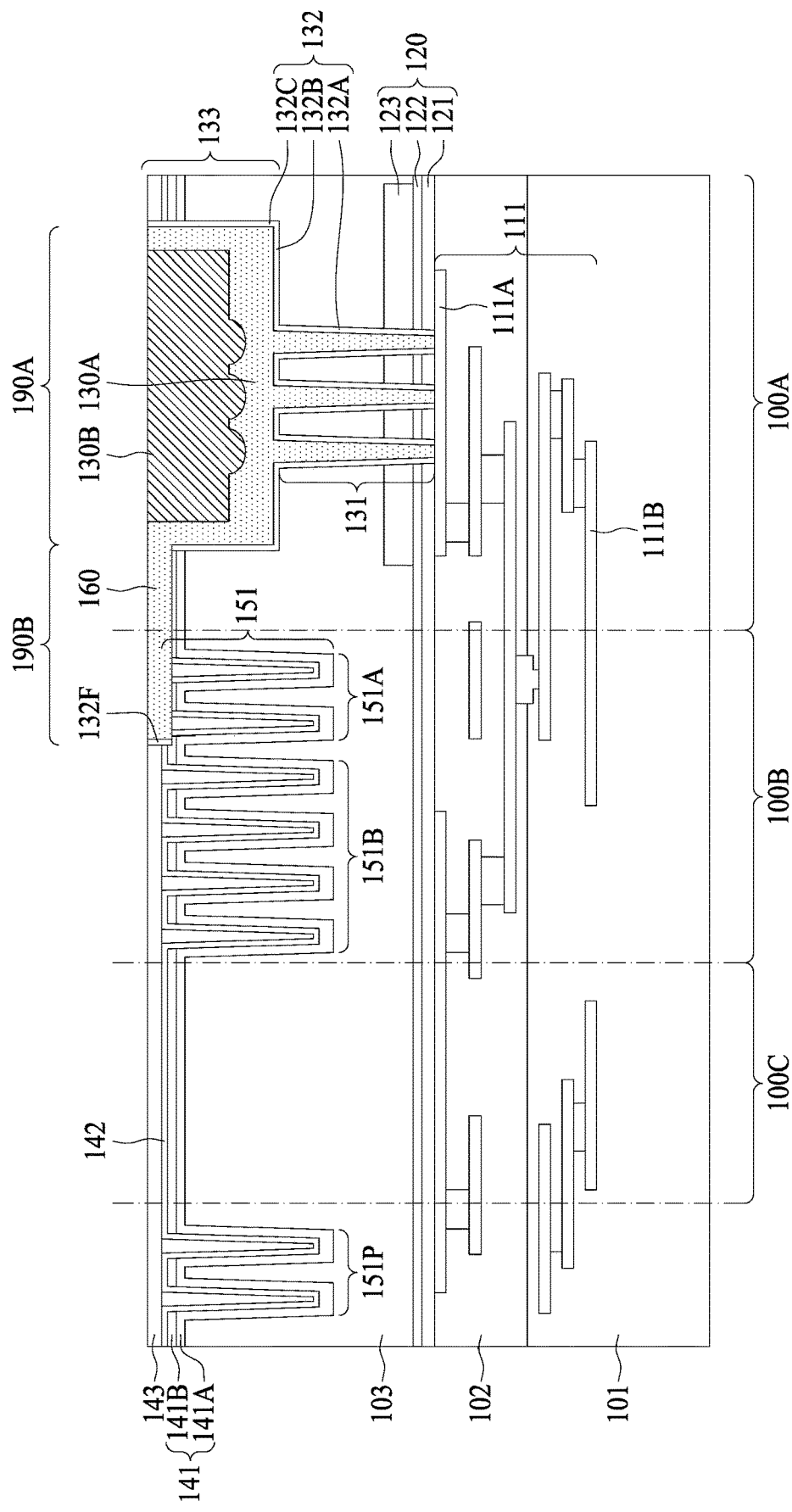

Referring to FIG. 15C, FIG. 15C is across sectional view of a semiconductor device during intermediate stages of manufacturing operations, according to some embodiments of the present disclosure. A planarization operation, such as chemical mechanical planarization operation is performed to remove excessive portion of the conductive material layer 130A and the conductive material layer 130B, thereby forming a conductive pad 133 in the first area 190A and a conductive layer 160 in the second area 190B. In some embodiments, the planarization operation stops at the capping layer 143. In some embodiments, the fourth portion 132D of the liner 132 over the top surface of the capping layer 143 may be removed in the planarization operation. In some embodiments, the conductive material layer 130B over the second area 190B is exposed. In some embodiments, the conductive material layer 130A and the conductive material layer 130B over the first area 190A is exposed. A top surface of the conductive material layer 130A and a top surface of the conductive material layer 130B may be coplanar.

Figure 15D:
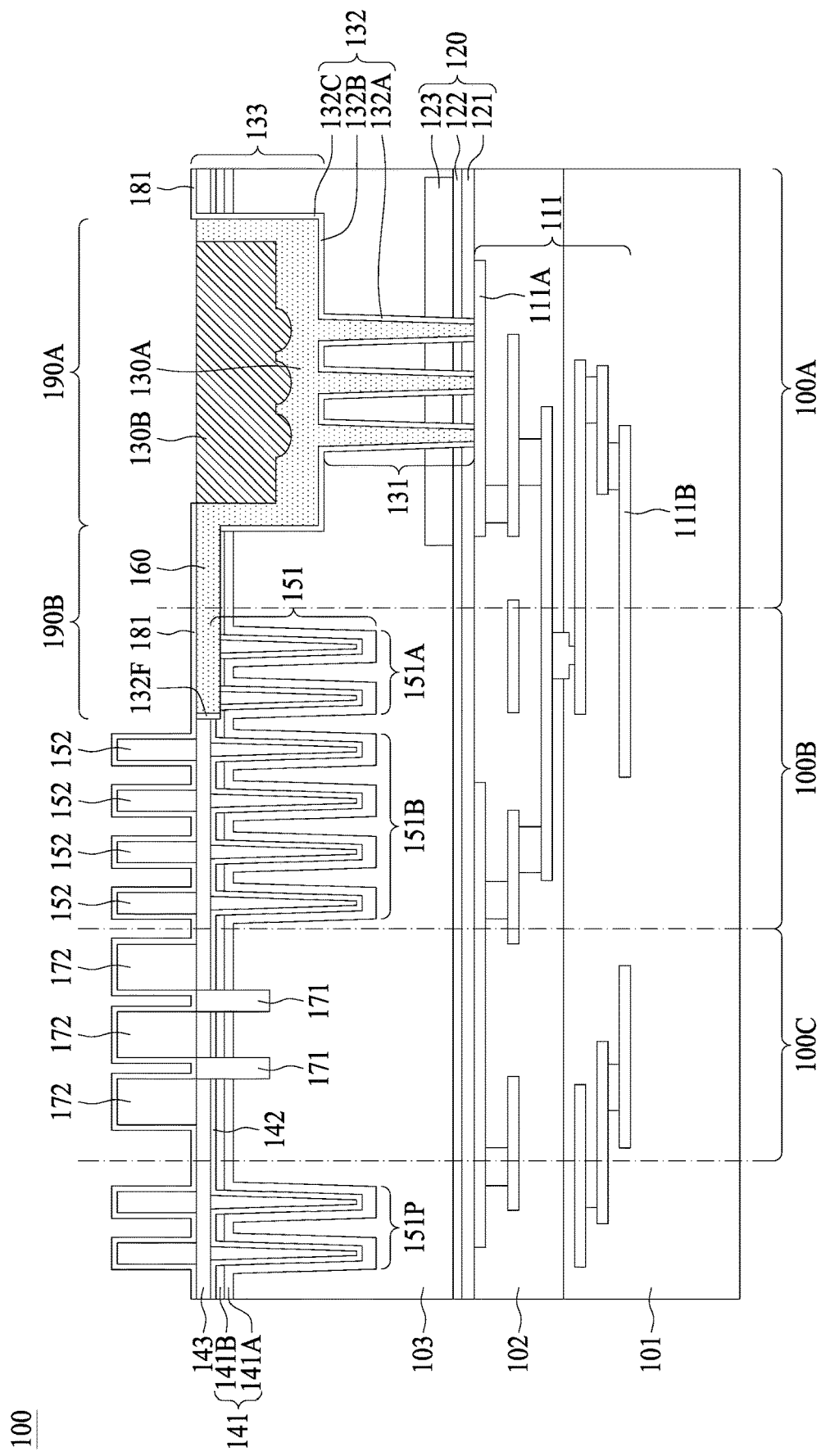

Referring to FIG. 15D, FIG. 15D is across sectional view of a semiconductor device during intermediate stages of manufacturing operations, according to some embodiments of the present disclosure. In some of the embodiments, fins 152 are formed above the capping layer 143 over the pixel region 100B. In some embodiments, the fins 152 can be dielectric fins, high-k fins, or made of other suitable materials utilized in fins. Some grids, waveguide structures, or optical devices can be further formed over the pixel region 100B. Alternatively, some or all of the fins 152 can be substituted with grids, waveguide structures, or optical devices.

In some embodiments, black level correction (BLC) structure 172 and backside grounding 171 can be formed in the functional region 100C. In some embodiments, the BLC structure 172 may be above the capping layer 143. In some embodiments, the backside grounding 171 penetrates the dielectric stack 141, the thin film 142, and the capping layer 143, and has a lower portion laterally surrounded by the device layer 103. However, it should be noted that the types of functional structures formed over the functional region 100C is not limited thereto. Other types of functional structures can be formed over the functional region 100C. For example, waveguide, grid structure, optical device, sensor, circuitry, fins, semiconductor device, or the like, can be formed over the functional region 100C.

A protection layer 181 is formed over the terminal region 100A, the pixel region 100B, and the functional region 100C. In some embodiments, the protection layer 181 may include insulation material. In some embodiments, a portion of the protection layer 131 over the terminal region 100A is removed, so that at least a portion of the conductive pad 133 is exposed from the protection layer 181.

It should be noted that the operations discussed in FIG. 4 to FIG. 15D can also be utilized in the fabrication of semiconductor device 200 (discussed in FIG. 2A), wherein the difference resides in the position of the second group of isolation structures 151B may be apart from the first group of isolation structures 151A, and the routing of connection between the first group of isolation structures 151A and the second group of isolation structures 151B may be adjusted according to the configuration. For example, additional routing of the isolation structure 151 may be formed to connect between the first group of isolation structures 151A and the second group of isolation structures 151B.

Figure 16A:
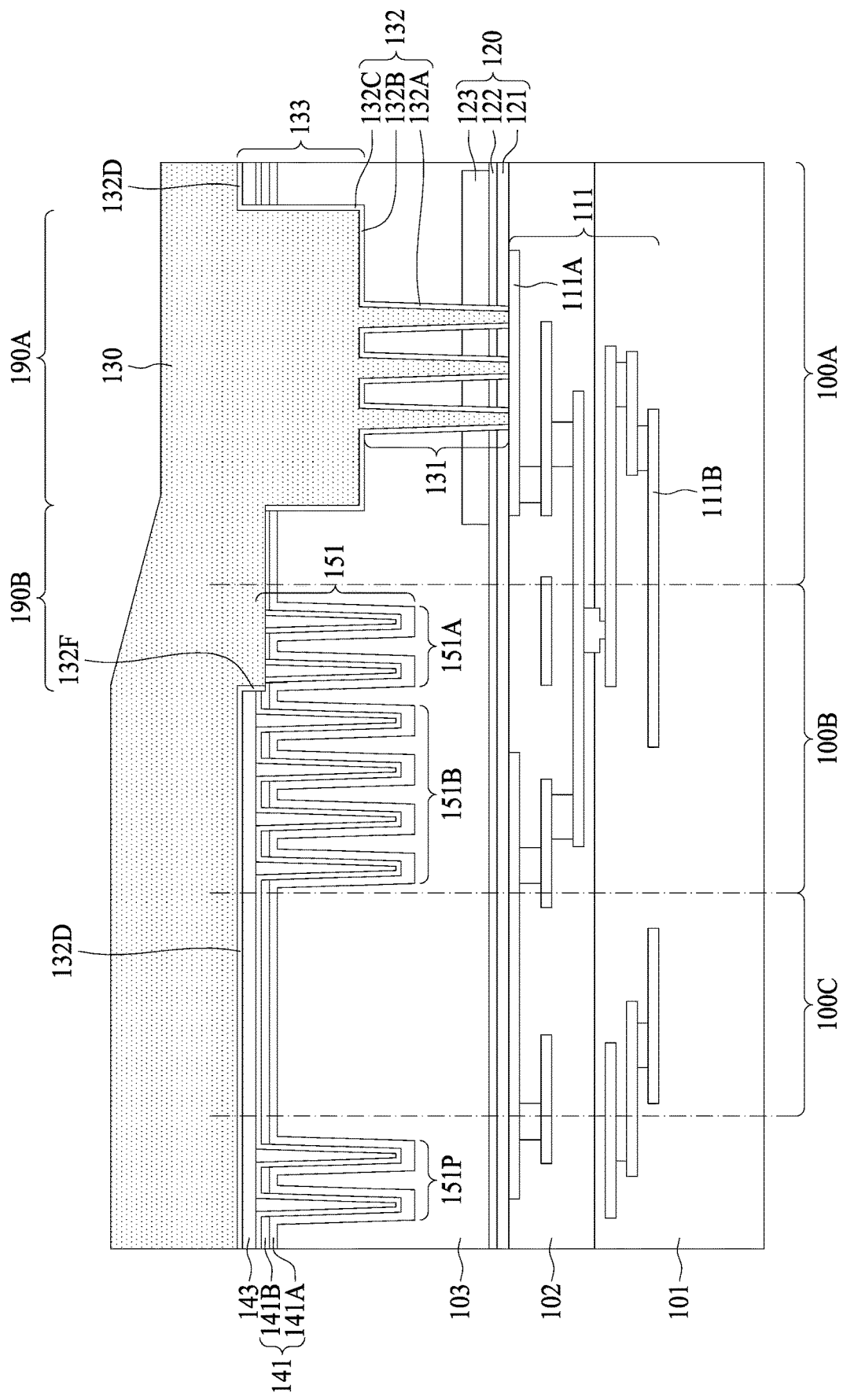
FIG. 16A to FIG. 16C are cross sectional views of a semiconductor device during intermediate stages of manufacturing operations, according to some embodiments of the present disclosure.

Referring to FIG. 16A, FIG. 16A is across sectional view of a semiconductor device during intermediate stages of manufacturing operations, according to some embodiments of the present disclosure. A conductive material layer 130 is formed in the second recess R2, the third recess R3 and the fourth recess R4 (shown in FIG. 14). In some embodiments, the conductive material layer 130 further covers and conforms the fourth portion 132D of the liner 132. In some embodiments, the conductive material layer 130 can include copper, aluminum copper or other suitable material. In some of the embodiments, the conductive material layer 130 may be formed in multiple steps, such as a chemical vapor deposition (CVD) followed by physical vapor deposition (PVD). Alternatively, the conductive material layer 130 may be formed by other types of deposition methods. Alternatively, the conductive material layer 130 may be formed in single steps with suitable deposition operations.

Figure 16B:
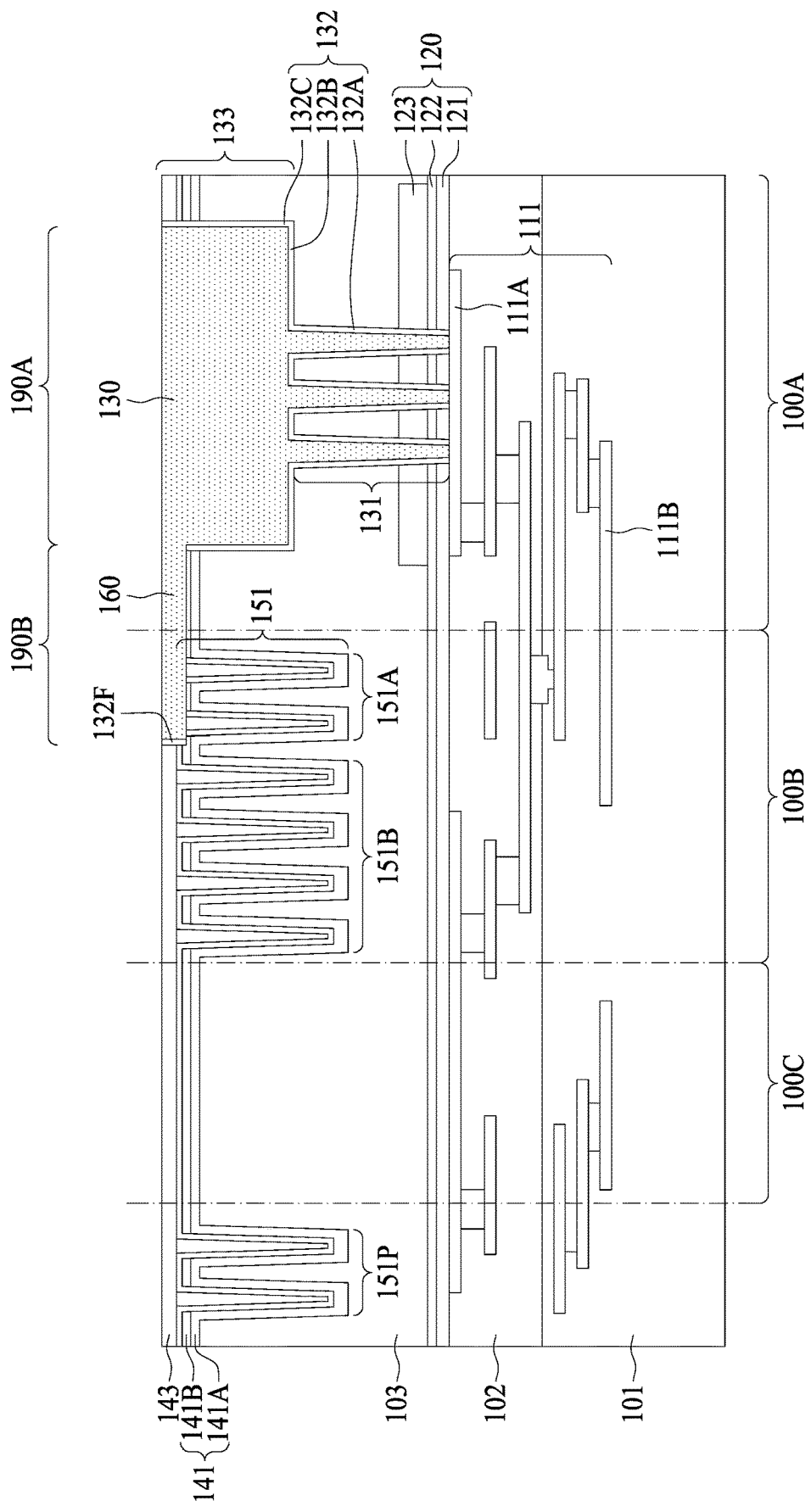

Referring to FIG. 16B, FIG. 16B is across sectional view of a semiconductor device during intermediate stages of manufacturing operations, according to some embodiments of the present disclosure. A planarization operation, such as chemical mechanical planarization operation is performed to remove excessive portion of the conductive material layer 130, thereby forming a conductive pad 133 in the first area 190A and a conductive layer 160 in the second area 190B. In some embodiments, the planarization operation stops at the capping layer 143. In some embodiments, the fourth portion 132D of the liner 132 over the top surface of the capping layer 143 may be removed in the planarization operation. In some embodiments, the conductive material layer 130 is exposed in the first area 190A and the second area 190B.

Figure 16C:
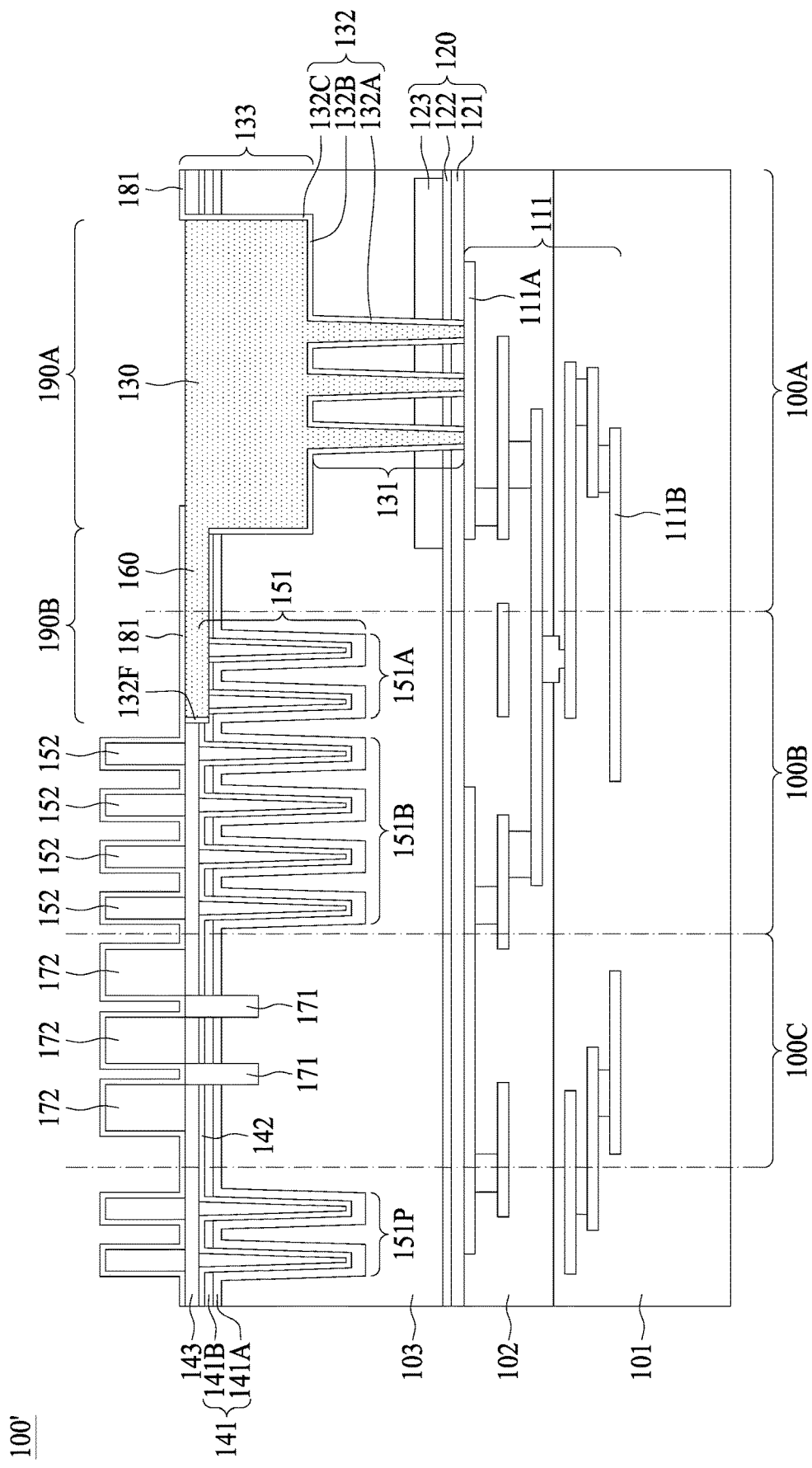

Referring to FIG. 16C, FIG. 16C is across sectional view of a semiconductor device during intermediate stages of manufacturing operations, according to some embodiments of the present disclosure. In some of the embodiments, fins 152 are formed above the capping layer 143 over the pixel region 100B. In some embodiments, the fins 152 can be dielectric fins, high-k fins, or made of other suitable materials utilized in fins. Some grids, waveguide structures, or optical devices can be further formed over the pixel region 100B. Alternatively, some or all of the fins 152 can be substituted with grids, waveguide structures, or optical devices.

In some embodiments, black level correction (BLC) structure 172 and backside grounding 171 can be formed in the functional region 100C. In some embodiments, the BLC structure 172 may be above the capping layer 143. In some embodiments, the backside grounding 171 penetrates the dielectric stack 141, the thin film 142, and the capping layer 143, and has a lower portion laterally surrounded by the device layer 103. However, it should be noted that the types of functional structures formed over the functional region 100C is not limited thereto. Other types of functional structures can be formed over the functional region 100C. For example, waveguide, grid structure, optical device, sensor, circuitry, fins, semiconductor device, or the like, can be formed over the functional region 100C.

A protection layer 181 is formed over the terminal region 100A, the pixel region 100B, and the functional region 100C. In some embodiments, the protection layer 181 may include insulation material, such as oxide. In some embodiments, a portion of the protection layer 181 over the terminal region 100A is removed, so that at least a portion of the conductive pad 133 is exposed from the protection layer 181.

It should be noted that the operations discussed in FIG. 4 to FIG. 14 and FIG. 16A to FIG. 16C can also be utilized in the fabrication of semiconductor device 200' (discussed in FIG. 2D), wherein the difference resides in the position of the second group of isolation structures 151B may be apart from the first group of isolation structures 151A, and the routing of connection between the first group of isolation structures 151A and the second group of isolation structures 151B may be adjusted according to the configuration. For example, additional routing of the isolation structure 151 may be formed to connect between the first group of isolation structures 151A and the second group of isolation structures 151B while providing improved adhesion.

Testing operation can be performed after a portion of the conductive pad 133 is exposed (or, after the semiconductor device 100, 100', 200, or 200' is fabricated). For example, the conductive pad 133 can be utilized as testing pad for probing, thereby determining the condition of the conductive routing 111 (e.g. electrical properties thereof, or whether the connection is proper) or other properties.

In some embodiments, after a portion of the conductive pad 133 is exposed, solder bump (not shown) can be disposed over the conductive pad 133, and the solder bump can be connected to an external bias. Such configuration allows a bias voltage to be applied to the isolation structures 151 through the conductive pad 133, since the isolation structures 151 may be electrically connected to the conductive pad 133 through the conductive layer 160. By using conductive material in the isolation structures 151 and applying bias voltage (such as providing negative bias), the hole density in the portion of the device layer 103 around the isolation structures 151 can be increased, thereby alleviating dark current/leakage current and white pixel issue. Quantum efficiency may also thereby be improved by virtue of having a design of thicker device layer 103. In some embodiments, the solder bump can be disposed over the conductive pad 133 after the aforementioned testing operation is performed.

The present disclosure provided semiconductor device 100 (shown in FIG. 1A), semiconductor device 100' (shown in FIG. 1C), semiconductor device 200 (shown in FIG. 2A), or semiconductor device 200' (shown in FIG. 2D) and the fabrication method thereof to address the issue of dark current, leakage current, crosstalk, white pixel, low quantum efficiency, or the like. Specifically, the conductive pad 133 can be utilized as testing pad and/or a medium for applying bias voltage to the isolation structures 151 made of conductive material. The fabrication operations of semiconductor device 100 (shown in FIG. 1A), semiconductor device 100' (shown in FIG. 1C), semiconductor device 200 (shown in FIG. 2A), or semiconductor device 200' (shown in FIG. 2D) can be applied to CMOS fabrication and can be utilized in advanced technology node, which may have smaller critical dimension of conductive features.

Furthermore, the isolation structures 151 can be utilized to alleviate crosstalk issue. The isolation structures 151 may include conductive material, such that bias voltage can be applied to the isolation structures 151 through the conductive pad 133, since the isolation structures 151 may be electrically connected to the conductive pad 133 through the conductive layer 160. By using conductive material in the isolation structures 151 and applying bias voltage (such as providing negative bias), the hole density in the portion of the device layer 103 around the isolation structures 151 can be increased, thereby alleviating dark current/leakage current and white pixel issue. Quantum efficiency may also thereby be improved by virtue of having a design of thicker device layer 103.

The fabrication of the isolation structures 151 is compatible to the formation of the conductive pad 133, which may reduce the complexity of forming the conductive pad 133. In comparative embodiments, surrounding pads with additional oxide dielectric layers may cause seams or peeling due to poor adhesion. In the present disclosure, liner 132 can be utilized to alleviate the seams/peeling issue. Furthermore, as discussed in FIG. 3A to FIG. 16C, the liner 132 can be formed in a way to allow the application of conductive layer 160 in terms that the isolation structures 151 can be electrically connected to the conductive pad 133. Also, the etching operation for forming the conductive pad 133 may have a greater operation window in compare to complicated comparative embodiment.

In addition, the aforesaid configuration allows bias voltage to be applied to the second group of isolation structures 151B through the first group of isolation structures 151A of the isolation structures 151 that may be in direct contact with the conductive layer 160. Alternatively stated, instead of having separated bias voltage input connected to separated isolation structures and apply bias voltage respectively, the aforesaid configuration of applying bias voltage to the second group of isolation structures 151B through the first group of isolation structures 151A helps achieving the minimization of the size of the semiconductor device 100.

Some embodiments of the present disclosure provide a semiconductor structure, including a device layer, including a terminal region and a pixel region adjacent to the terminal region, a conductive pad in the terminal region, and an isolation structure in the pixel region, wherein the isolation structure includes a first conductive material.

Some embodiments of the present disclosure provide a semiconductor structure, including a device layer, including a terminal region and a pixel region adjacent to the terminal region, a conductive pad in the terminal region, a plurality of isolation structures in the pixel region, including a first plurality of isolation structures and a second plurality of isolation structures, and a conductive layer crossing over the terminal region and the pixel region, electrically connecting the conductive pad and the plurality of isolation structures.

Some embodiments of the present disclosure provide a method for fabricating a semiconductor structure, including forming a conductive pad in a terminal region of a device layer, forming an isolation structure in a pixel region of the device layer, wherein the terminal region is adjacent to the pixel region, and forming a conductive layer electrically connecting the isolation structure and the conductive pad.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a device layer, comprising a terminal region and a pixel region adjacent to the terminal region;
   a conductive pad in the terminal region; and
   an isolation structure in the pixel region, wherein the isolation structure comprises a first conductive material, and wherein the isolation structure further comprising:
      a plurality of first isolation structures, and
      a plurality of second isolation structures laterally adjacent to the plurality of first isolation structures, a bottom of each of the second isolation structures is at a level substantially identical to a bottom of each of the first isolation structures, and a top of each of the second isolation structures is at a level above a top of each of the first isolation structures;
      wherein a top surface of the conductive pad is above the top of each of the first isolation structures, and a bottom-most surface of the conductive pad as a whole is above the bottom of each of the first isolation structures and below the top of each of the first isolation structures, the bottom-most surface of the conductive pad is in connection to a plurality of conductive vias, and the conductive pad is closer to the first isolation structures than the second isolation structures.

2. The semiconductor structure of claim 1, wherein the plurality of conductive vias connect the bottom-most surface of the conductive pad to a logic layer underlying the device layer.

3. The semiconductor structure of claim 1, wherein the isolation structure is a trench isolation structure between pixels, and the first conductive material is aluminum.

4. The semiconductor structure of claim 2, wherein the conductive pad comprises a second conductive material and a third conductive material different from the second conductive material, wherein the second conductive material laterally surrounds the third conductive material, and wherein the conductive via comprises only the second conductive material.

5. The semiconductor structure of claim 4, wherein a portion of the second conductive material of the conductive pad further comprises a concave surface over the conductive via, and the concave surface is in contact with the third conductive material.

6. The semiconductor structure of claim 1, wherein the conductive pad is electrically connected to the isolation structure.

7. A semiconductor structure, comprising:
   a device layer, comprising a terminal region and a pixel region adjacent to the terminal region;
   a conductive pad in the terminal region;
   a plurality of isolation structures in the pixel region, comprising a first plurality of isolation structures and a second plurality of isolation structures, wherein a bottom of each of the first plurality of isolation structures is at a level substantially identical to a bottom of each of the second plurality of isolation structures, and wherein a top surface of the conductive pad is above a top of each of the first plurality of isolation structures, and a bottom-most surface of the conductive pad as a whole is above the bottom of each of the first plurality of isolation structures and below the top of each of the first plurality of isolation structures; and
   a conductive layer crossing over the terminal region and the pixel region, electrically connecting the conductive pad and the plurality of isolation structures, wherein the conductive layer continuously extends over the first plurality of isolation structures and without covering the second plurality of isolation structures.

8. The semiconductor structure of claim 7, wherein the first plurality of isolation structures is under a vertical projection of the conductive layer.

9. The semiconductor structure of claim 7, wherein the plurality of isolation structures comprises a conductive material.

10. The semiconductor structure of claim 7, wherein the first plurality of isolation structures is electrically connected to the second plurality of isolation structures.

11. The semiconductor structure of claim 7, wherein a top surface of each of the second plurality of isolation structures is at a level above a level of a top surface of each of the first plurality of isolation structures.

12. The semiconductor structure of claim 7, further comprising:
   a logic layer stacked with the device layer; and
   a conductive via connecting a bottom of the conductive pad to a metallization structure of the logic layer.

13. The semiconductor structure of claim 7, wherein a height of each of the first plurality of isolation structures is different from a height of each of the second plurality of isolation structures.

14. A method for fabricating a semiconductor structure, comprising:
   forming a plurality of isolation structures in a pixel region of a device layer, wherein the pixel region is between a terminal region and a functional region in which one or more functional structures are disposed, and wherein forming the plurality of isolation structures comprising:

forming a first conductive material in a plurality of first recesses in the pixel region of the device layer, wherein a height of the plurality of first recesses is the same; and planarizing the first conductive material to form a plurality of second isolation structures in the plurality of first recesses;

removing a portion of the first conductive material from a top of a portion of the plurality of second isolation structures to form a plurality of first isolation structures;

depositing a second conductive material to simultaneously form a conductive pad in the terminal region of the device layer and a conductive layer over the top of the plurality of first isolation structures in the pixel region, the conductive layer being electrically connecting the first isolation structures and the conductive pad, wherein the second conductive material covers the second isolation structures and the functional region.

15. The method of claim 14, wherein depositing the second conductive material to form the conductive pad comprises performing a conductive pad trench forming operation prior to the second conductive material deposition operation.

16. The method of claim 15, wherein the second conductive material deposition operation comprises a Cu or AlCu chemical vapor deposition and an AlCu physical vapor deposition.

17. The method of claim 15, further comprising forming a conductive via trench from a bottom surface of the conductive pad trench.

18. The method of claim 14, further comprising forming a protection layer over the terminal region and the pixel region after forming the conductive pad and the conductive layer.

19. The method of claim 18, further comprising exposing a portion of a top surface of the conductive pad from the protection layer.

20. The method of claim 14, wherein the plurality of first isolation structures formed from the portion number of the plurality of second isolation structures are in proximity to a first lateral side of the pixel region, and another portion number of the plurality of second isolation structures free from being used to form the plurality of first isolation structures are in proximity to a second lateral side of the pixel region opposite to the first lateral side of the pixel region.

* * * * *